(12) United States Patent
Yeh et al.

(10) Patent No.: US 10,371,979 B2
(45) Date of Patent: Aug. 6, 2019

(54) DISPLAY PANEL AND MANUFACTURING METHOD THEREOF

(71) Applicant: HannStar Display Corporation, Taipei (TW)

(72) Inventors: Cheng-Yen Yeh, Taichung (TW); Kuo-Chang Su, Tainan (TW)

(73) Assignee: HannStar Display Corporation, Taipei (TW)

( * ) Notice: Subject to any disclaimer, the term of this patent is extended or adjusted under 35 U.S.C. 154(b) by 19 days.

(21) Appl. No.: 15/717,930

(22) Filed: Sep. 27, 2017

(65) Prior Publication Data

US 2018/0373079 A1   Dec. 27, 2018

(30) Foreign Application Priority Data

Jun. 22, 2017   (CN) .......................... 2017 1 0481393

(51) Int. Cl.
| | |
|---|---|
| *G06F 3/041* | (2006.01) |
| *G06F 3/044* | (2006.01) |
| *G02F 1/1333* | (2006.01) |
| *G02F 1/1362* | (2006.01) |
| *H01L 29/786* | (2006.01) |

(52) U.S. Cl.
CPC .... *G02F 1/13338* (2013.01); *G02F 1/133345* (2013.01); *G02F 1/136209* (2013.01); *G06F 3/044* (2013.01); *G06F 3/0412* (2013.01); *G02F 2201/121* (2013.01); *G06F 2203/04103* (2013.01); *H01L 29/78633* (2013.01)

(58) Field of Classification Search
CPC ........... G02F 1/13338; G02F 1/133345; G02F 1/136209; G02F 2201/121; G06F 3/044; G06F 3/0412; G06F 2203/04103; H01L 29/78633
See application file for complete search history.

(56) References Cited

U.S. PATENT DOCUMENTS

| | | | | |
|---|---|---|---|---|
| 8,217,913 | B2* | 7/2012 | Hotelling | G06F 3/0412 345/173 |
| 8,743,301 | B2* | 6/2014 | Shin | G06F 3/0412 345/173 |
| 2016/0054609 | A1* | 2/2016 | Kim | G06F 3/0412 438/24 |
| 2017/0060313 | A1* | 3/2017 | Kim | G06F 3/044 |
| 2017/0300156 | A1* | 10/2017 | Oh | G02F 1/13338 |
| 2018/0188581 | A1* | 7/2018 | Peng | G02F 1/133345 |

* cited by examiner

*Primary Examiner* — Nathanael R Briggs
(74) *Attorney, Agent, or Firm* — CKC & Partners Co., LLC

(57) ABSTRACT

A display panel includes the following components. A metal layer includes a touch sensing line and a data line. An insulation layer is disposed on the metal layer and has a first opening used to expose at least a portion of the touch sensing line as a first connection part. A common electrode is disposed on the insulation layer. The common electrode is part of a touch electrode, and the common electrode has a second opening above the first opening. Another insulation layer is disposed on the common electrode, and has a third opening above the second opening to expose at least a portion of the common electrode as a second connection part. The connection electrode electrically connects the first connection part to the second connection part through the third opening, the second opening and the first opening.

35 Claims, 32 Drawing Sheets

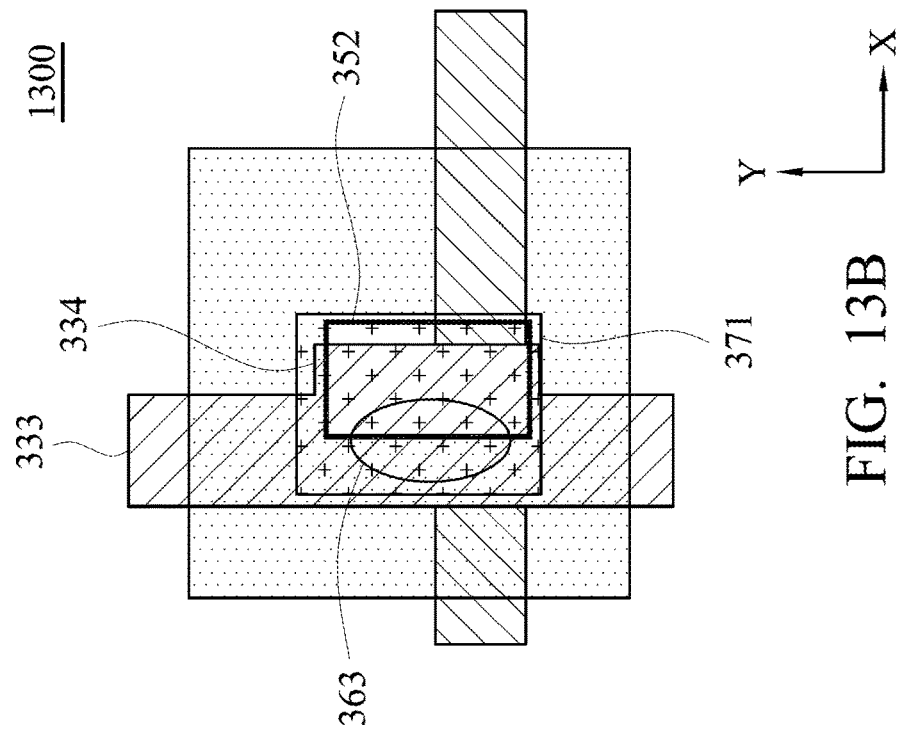
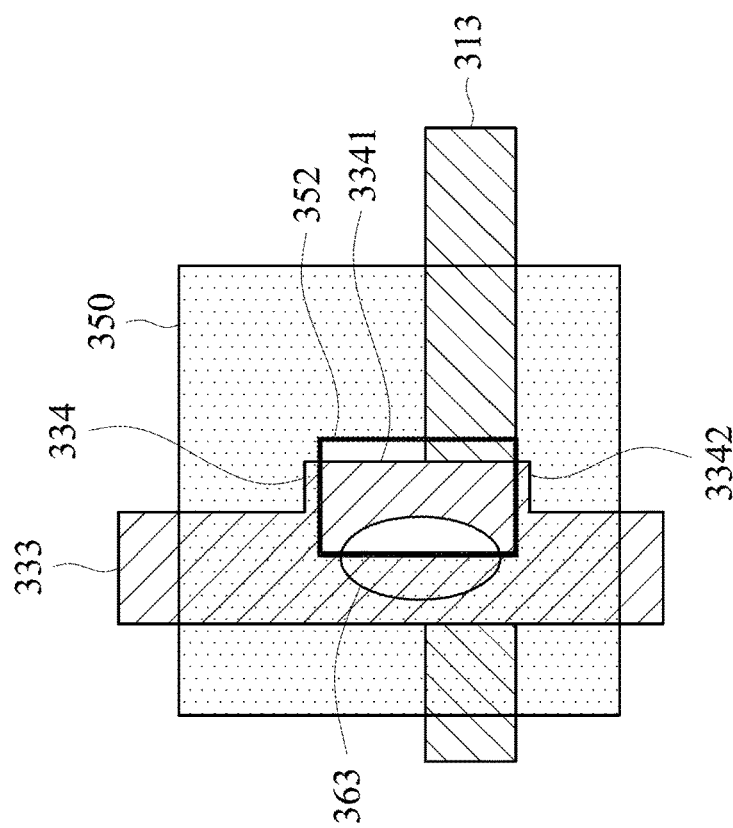
FIG. 13B
FIG. 13A

DISPLAY PANEL AND MANUFACTURING METHOD THEREOF

RELATED APPLICATIONS

This application claims priority to China Application Serial Number 201710481393.6 filed Jun. 22, 2017, which is herein incorporated by reference.

BACKGROUND

Field of Invention

The present invention relates to a display panel. More particularly, the present invention relates to an in-cell touch display panel.

Description of Related Art

In an in-cell touch display device, a touch electrode which provides a touch function is disposed in a pixel structure. The touch electrode is connected to a circuit through a conductive line. The circuit may detect a capacitance variance of the touch electrode to determine whether a corresponding position of the touch display device is touched. In general, in a touch sensing period, the touch electrode is used for sensing touch; and in a display period, a common voltage is applied to the touch electrode which would serve as a common electrode. However, it is an issue in the art about how to reduce the cost of manufacturing the display panel while the functions of the touch electrode are still provided.

SUMMARY

A display panel and a method for manufacturing the display panel are provided, in which fewer processes are required to produce an in-cell touch display panel.

Embodiments of the invention provide a display panel including a substrate and pixel structures. At least one pixel structure includes the following components. A first metal layer is disposed on the substrate and includes a scan line. A first insulation layer is disposed on the substrate and the first metal layer. A second metal layer is disposed on the first insulation layer and includes a touch sensing line and a data line. A second insulation layer is disposed on the first insulation layer and the second metal layer. The second insulation layer has a first opening used to expose a portion of the touch sensing line as a first connection part. A common electrode is disposed on the second insulation layer, in which the common electrode has a second opening located above the first opening. A third insulation layer is disposed on the common electrode, in which the third insulation layer has a third opening located above the second opening, and the third opening exposes a portion of the common electrode as a second connection part. A connection electrode is disposed on the third insulation layer, in which the connection electrode connects the first connection part to the second connection part through the third opening, the second opening and the first opening.

In some embodiments, a ratio of an area of the portion of the second connection part exposed by the third opening to an area of the third opening is in a range substantially from 0.1 to 1.

In some embodiments, the second connection part is partially overlapped with the first opening.

In some embodiments, the connection electrode is in contact with the first connection part by a first contact area, the connection electrode is in contact with the second connection part by a second contact area, and a ratio of the first contact area to the second contact area is in a range substantially from 0.1 to 10.

In some embodiments, the pixel structure further includes the following components. A gate is formed by the first metal layer. A source and a drain are formed by the second metal layer. A semiconductor layer is spatially separated from the gate. A pixel electrode is disposed on the third insulation layer, in which the pixel electrode has at least one slit, and the pixel electrode and the connection electrode are formed by a same process. The second insulation layer further includes a fourth opening used to expose a portion of the drain, the common electrode has a fifth opening overlapped with the fourth opening, and the third insulation layer has a sixth opening overlapped with the fourth opening. The pixel electrode is connected to the drain through the fourth opening, the fifth opening and the sixth opening.

In some embodiments, the fifth opening is in a position above the semiconductor layer along a direction perpendicular to the substrate.

In some embodiments, an area of the second opening is smaller than an area of the fifth opening from a top view perpendicular to the substrate.

In some embodiments, the touch sensing line has an extending portion, and the extending portion overlaps with an area of the third opening along a direction perpendicular to the substrate.

In some embodiments, the extending portion is overlapped with the scan line along a direction perpendicular to the substrate.

In some embodiments, an area of the connection electrode is greater than an area of the third opening. The connection electrode includes three portions. A first portion is overlapped with the third opening and connected to the common electrode. A second portion is partially overlapped with the third opening and connected to the touch sensing line. A third portion is not overlapped with the third opening, in which the third portion is formed on the third insulation layer and is connected to the first portion and the second portion.

In some embodiments, the display panel further includes multiple touch electrodes. Each of the touch electrodes corresponds to a portion of the pixel structures, and a gap between the touch electrodes is located between the touch sensing line and another data line adjacent to the touch sensing line.

From another aspect, embodiments of the invention provide a display panel having a display area and a non-display area. The display panel includes a substrate and a pixel structure in the display area. The pixel structure includes the following units. A first conductive layer is disposed on the substrate and includes a scan line and a gate. A first insulation layer is disposed on the first conductive layer. A semiconductor layer is disposed on the first insulation layer or under the first insulation layer. A second conductive layer is disposed on the first insulation layer and includes a touch sensing line, a data line, a source and a drain. A second insulation layer is disposed on the first insulation layer and the second conductive layer, in which the second insulation layer has a first opening to expose a portion of the touch sensing line. A first transparent electrode is disposed on the second insulation layer and has a second opening above the first opening. A third insulation layer is disposed on the first transparent electrode, in which the third insulation layer has a third opening above the second opening, and the third opening exposes a portion of the first transparent electrode. A connection electrode is disposed on the third insulation layer, and is electrically connecting the first transparent electrode to the touch sensing line through the third opening, the second opening and the first opening. An area of the third opening is partially overlapped with an area of the second opening.

In some embodiments, a contour of the third opening and a contour of the second opening intersect at least two locations, and a portion of the contour of the third opening is in an area of the second opening from a top view perpendicular to the substrate.

In some embodiments, the touch sensing line has an extending portion, and the extending portion is overlapped with the third opening along a direction perpendicular to the substrate.

In some embodiments, the extending portion is overlapped with the scan line along a direction perpendicular to the substrate.

In some embodiments, the scan line extends along a first direction, the touch sensing line extends along a second direction, and an angle between the first direction and the touch sensing line is in a range from 75 degrees to 105 degrees.

In some embodiments, at least one of the first transparent electrode and the extending portion is in an area overlapped with the third opening and the scan line along a direction perpendicular to the substrate.

In some embodiments, the extending portion covers a segment of the scan line, and an edge of the extending portion is spaced from the scan line by a distance greater than or equal to 1.2 micro meters.

In some embodiments, a width of the touch sensing line is greater than a width of the data line.

In some embodiments, a second transparent electrode is disposed on the third insulation layer, in which the second transparent electrode has a slit pattern.

In some embodiments, the first transparent electrode is a common electrode, the second transparent electrode is a pixel electrode, and the pixel electrode is electrically connected to the drain.

In some embodiments, the first transparent electrode is a pixel electrode and is electrically connected to the drain, and the second transparent electrode is a common electrode.

In some embodiments, the connection electrode covers over half of the third opening.

In some embodiments, an opposite substrate is disposed opposite to the substrate. A liquid crystal layer is disposed between the substrate and the opposite substrate.

In some embodiments, the semiconductor layer is formed by polysilicon and is under the first insulation layer.

In some embodiments, the semiconductor layer is formed by continuous grain silicon, amorphous silicon or oxide semiconductor, and is on the first insulation layer.

In some embodiments, the portion of the first transparent electrode exposed by the third opening is overlapped with the first opening along a direction perpendicular to the substrate.

From another aspect, embodiments of the invention provide a display panel including a substrate and a pixel structure. The pixel structure includes the following units. A scan line extends along a first direction. A data line extends along a second direction. A first insulation layer is disposed between the scan line and the data line. A touch sensing line extends along the second direction and on the first insulation layer. An angle between the touch sensing line and the first direction is in a range from 75 degrees to 105 degrees. A second insulation layer is disposed between the first insulation layer and the touch sensing line. The second insulation layer has a first opening to expose a portion of the touch sensing line. A touch electrode is disposed on the second insulation layer, in which the touch electrode has a second opening above the first opening, and the second opening is at least partially overlapped with the touch sensing line along a direction perpendicular to the substrate. A third insulation layer is disposed on the touch electrode, in which the third insulation layer has a third opening above the second opening, and the third opening exposes a portion of the touch electrode. A connection electrode is disposed on the third insulation layer, in which the connection electrode is connected to the portion of the touch electrode and the portion of the touch sensing line through the third opening, the second opening and the first opening. A pixel electrode has a slit pattern and is disposed on the third insulation layer.

In some embodiments, an opposite substrate is disposed opposite to the substrate. A liquid crystal layer is disposed between the substrate and the opposite substrate, in which the liquid crystal layer includes multiple positive liquid crystal molecules, negative liquid crystal molecule or a combination thereof. Alignment films are disposed at a side of the substrate and a side of the opposite substrate that are adjacent to the liquid crystal layer.

From another aspect, embodiments of the invention provide a method for manufacturing a display panel. The method includes: providing a substrate: forming a patterned first conductive layer on the substrate, in which the patterned first conductive layer includes a scan line and a gate; forming a first insulation layer on the patterned first conductive layer; forming a patterned second conductive layer on the first insulation layer, in which the patterned second conductive layer includes a touch sensing line, a data line, a source and a drain; forming a second insulation layer on the patterned second conductive layer; forming a patterned first transparent electrode on the second insulation layer, in which the patterned first transparent electrode has a second opening; forming a third insulation layer on the patterned first transparent electrode; performing an etching process corresponding to the third insulation layer and the second insulation layer, so as to form a third opening in the third insulation layer and form a first opening in the second insulation layer, in which the third opening exposes a portion of the first transparent electrode, an area of the third opening is partially overlapped with an area of the second opening, and the first opening exposes a portion of the touch sensing line; and forming a connection electrode on the third insulation layer, in which the connection electrode electrically connects the first transparent electrode to the touch sensing line through the third opening, the second opening, and the first opening.

In some embodiments, the method further includes: forming a patterned semiconductor layer on the first insulation layer or under the first insulation layer.

In some embodiments, the method further includes: forming a patterned light shielding layer on the substrate and under the semiconductor layer; forming a fourth insulation layer on the patterned light shielding layer, in which the fourth insulation layer is disposed between the substrate and the first insulation layer; and forming a fifth insulation layer on the patterned semiconductor layer, in which the patterned semiconductor layer is under the gate.

In some embodiments, the method further includes: forming a fifth opening in the patterned first transparent electrode; forming a fourth opening in the second insulation layer and forming a sixth opening in the third insulation layer in the etching process, in which the etching process is a dry etching process or a wet etching process; and forming a second transparent electrode on the third insulation layer, in which the second transparent electrode is connected to the drain through the fourth opening, the fifth opening, and the sixth opening, and the second transparent electrode and the connection electrode are formed by a same process.

In some embodiments, the method further includes: forming the patterned first transparent electrode to comprise an approximate rectangular contour. The ratio of the approximate rectangular contour's length to the approximate rectangular contour's width is in a range from 1:1 to 1.3:1.

In some embodiments, the method further includes: etching the second insulation layer along a direction parallel with the substrate in the etching process forming the first opening, so as to generate under cutting under the first transparent electrode.

In some embodiments, the method further includes: forming the patterned first transparent electrode to comprise an approximate rectangular contour. The ratio of the approximate rectangular contour's length to the approximate rectangular contour's width is in the range from 1:1 to 1.3:1.

In some embodiments, the method further includes: forming a contact hole in the first insulation layer for allowing the patterned second metal layer electrically connecting to the first patterned metal layer through the contact hole in a non-display area.

Compared with the prior art which needs two processes to form the first opening and the third opening respectively, in the touch structure and the manufacturing method of the invention, the first opening and the third opening are formed by the same etching process. And, the connection electrode provides a good and effective electrical connection between the first transparent electrode (i.e. common electrode) and the touch sensing line even a situation of under cutting occurs at the second insulation layer under the first transparent electrode. An ineffective electrical connection may occur, for example, because the connection electrode is cut off or because a thickness of the electrode in an area is too thin, causing an excessive resistance, although the connection electrode is not cut off. As a result, a photolithography process is saved, a defective rate is decreased, material cost is reduced, and a yield per time unit is increased.

BRIEF DESCRIPTION OF THE DRAWINGS

The invention can be more fully understood by reading the following detailed description of the embodiment, with reference made to the accompanying drawings as follows.

FIG. 13A and FIG. 13B are top views of intermedia step for manufacturing the contact structure in accordance with an embodiment.

DETAILED DESCRIPTION

Specific embodiments of the present invention are further described in detail below with reference to the accompanying drawings, however, the embodiments described are not intended to limit the present invention and it is not intended for the description of an operation to limit the order of implementation. Moreover, any device with equivalent functions that are produced from a structure formed by a recombination of elements shall fall within the scope of the present invention. Additionally, the drawings are only illustrative and are not drawn to actual size.

The using of "first", "second", "third", etc. in the specification should be understood for identifying units or data described by the same terminology, but are not referred to particular order or sequence.

Figure 1:
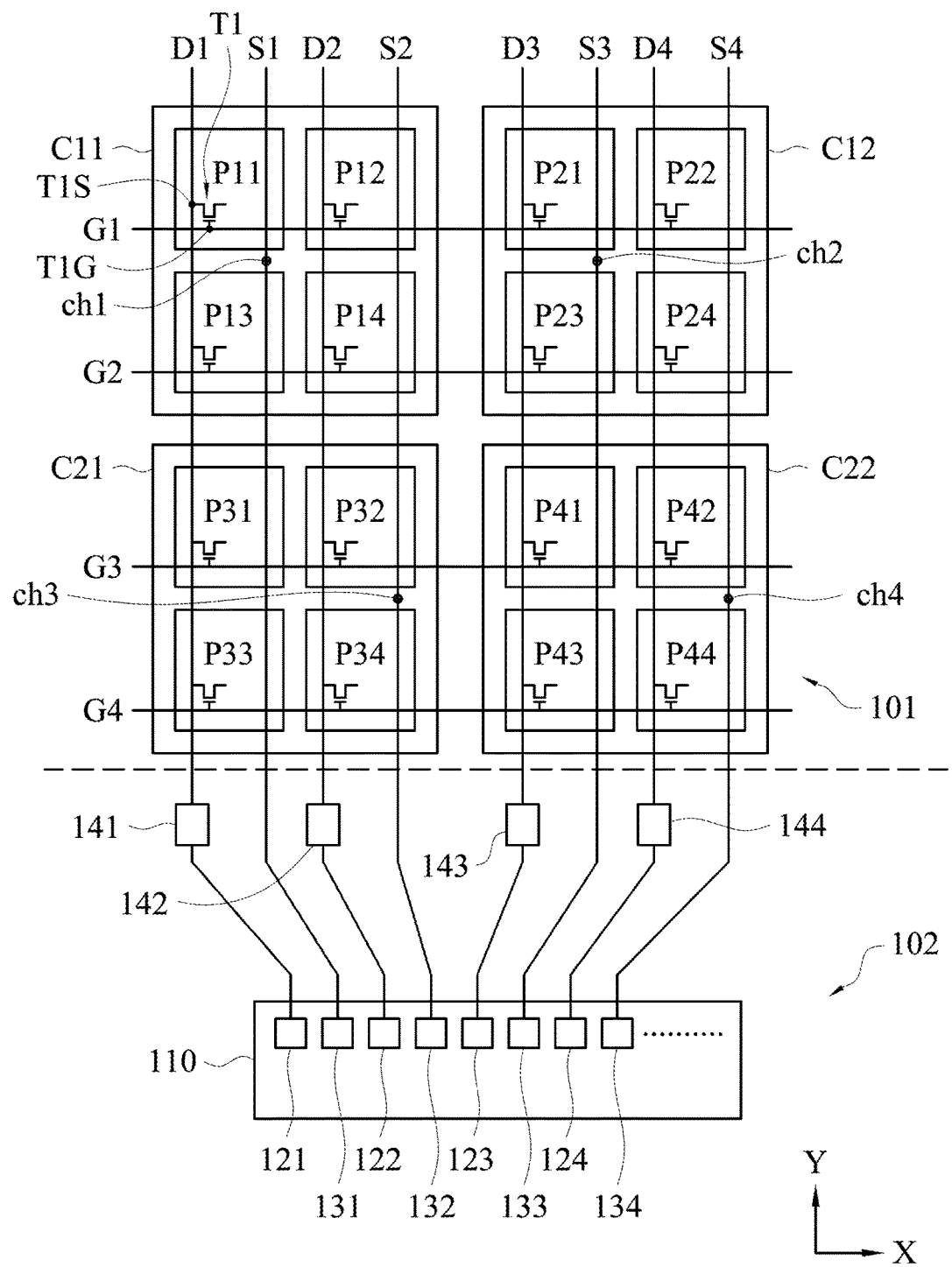
FIG. 1 is schematic diagram illustrating a connection between a data line and a touch sensing line in an in-cell touch display panel in accordance with an embodiment.

FIG. 1 is a schematic diagram illustrating a type of design showing touch electrodes, data lines and touch sensing lines in an in-cell touch display panel in accordance with an embodiment. Referring to FIG. 1, an in-cell touch display panel 100 includes a display area 101 and a non-display area 102. The display area 101 is described first. The display area 101 includes multiple pixel structures P11-P14, P21-P24, P31-P34, and P41-P44; scan lines G1-G4 extending along a X direction (also referred to as a first direction); data lines D1-D4 extending along a Y direction (also referred to as a second direction); and touch sensing lines S1-S4 extending along the Y direction. The data lines D1-D4 and touch sensing lines S1-S4 could be designed as straight or zigzag patterns and extend along the Y direction. Therefore, an angle between the first direction and the touch sensing lines S1-S4 is in a range from 75 degrees to 105 degrees, in which an embodiment of 90-degree angle is shown in FIG. 1. Each pixel structure includes a thin film transistor, each of the data lines D1-D4 is electrically connected to a source of the corresponding thin film transistor, and each of the scan lines G1-G4 is electrically connected to a gate of the corresponding thin film transistor. For example, the pixel structure P11 includes a thin film transistor T1 which has a gate T1G and a source T1S. The scan line G1 is electrically connected to the gate T1G, and the data line D1 is electrically connected to the source T1S.

The in-cell touch display panel 100 further includes touch electrodes C11, C12, C21, and C22. Each touch electrode corresponds to multiple pixel structures of all pixel structures in the display area. Each touch electrode is electrically connected to one touch sensing line through a contact hole ch. For example, the touch electrode C11 corresponds to the pixel structures P11-P14 and is electrically connected to the touch sensing line S1, and that is to say, each of the pixel structures P11-P14 has a portion of the touch electrode C11. From another aspect, the touch electrode C11 is shared by the pixel structures P11-P14 as a common electrode receiving a common voltage in a display period. The touch electrode C12 corresponds to the pixel structures P21-P24 and is electrically connected to the touch sensing line S3, and that is to say, each of the pixel structures P21-P24 includes a portion of the touch electrode C12. The touch electrode C21 corresponds to the pixel structures P31-P34 and is electrically connected to the touch sensing line S2, and that is to say, each of the pixel structures P31-P34 includes a portion of the touch electrode C21. The touch electrode C22 corresponds to the pixel structures P44-P44 and is electrically connected to the touch sensing line S4, and that is to say, each of the pixel structures P41-P44 includes a portion of the touch electrode C22. The number of the pixel structures to which one touch electrode corresponds is not limited in the invention, and this number can be decided based on a design requirement. In addition, the areas of the touch electrodes C11, C12, C21, and C22 may be the same or different (e.g. the touch electrode C11 is smaller or larger than the touch electrode C12, C21, C22 or the touch electrode C11 is larger than the touch electrode C12 but smaller than C21, etc.), and the areas can be decided based on a design requirement.

A frame period is divided into one or more display periods and one or more touch periods. In the display period, the touch electrodes C11, C12, C21, and C22 are coupled to a common voltage to serve as common electrodes. From another aspect, each pixel structure includes one common electrode and one pixel electrode which is electrically connected to the drain of one thin film transistor). The voltage difference between the common electrode and the pixel electrode is used to decide display brightness. In the embodiment of FIG. 1, the common electrodes of four adjacent pixel structures are connected to each other and belong to the same touch electrode. For example, all the common electrodes in the pixel structures P11-P14 belong to the touch electrode C11, and therefore all voltages of the common electrodes in the pixel structures P11-P14 are the same (equal to the common voltage) in the display period. Voltages of the scan lines G1-G4 are configured to sequentially turn on the corresponding thin film transistor, and a driving circuit 110 transmits pixel data to the corresponding pixel electrode through the data lines D1-D4. On the other hand, in the touch period, the touch electrodes C11, C12, C21, C22 are used to detect a touch event by an object such as multiple fingers on the in-cell touch display panel 100, and the driving circuit 110 would detect voltage variances (caused by capacitance variances) of the touch electrodes C11, C12, C21, C22 through the touch sensing lines S1-S4, so as to generate a touch sensing signal. In other words, a spatial resolution of the touch operation depends on the number of the touch electrodes, and a spatial resolution of display depends on the number of the pixel structures. To be more specific, the in-cell touch display panel with capacitive touch technology is adopted in the invention.

Multiple display pads 121-124 and touch pads 131-134 are disposed in the non-display area 102. The display pads 121-124 are electrically connected to the data lines D1-D4 respectively. The touch pads 131-134 are electrically connected to the touch sensing lines S1-S4 respectively. The display pads 121-124 and the touch pads 131-134 are electrically connected to the driving circuit 110 which may be disposed on a flexible circuit board such as Tape Carrier Package (TCP) or Chip on Film (COF), or the driving circuit 110 may be disposed on the thin film transistor substrate.

In some embodiments, the data lines D1-D4 and the touch sensing lines S1-S4 are formed by a second metal layer. The touch sensing lines S1-S3 are respectively adjacent to the data lines D2-D4 and disposed on a first insulation layer. For example, the touch sensing line S1 in the pixel structure P11 is adjacent to the data line D2 in the adjacent pixel structure P12. In other embodiments, not all pixel structures have the touch sensing line. It is possible that only one of multiple pixel structures has one touch sensing line. For example, only one of every three pixel structures has one touch sensing line (not shown). Connection structures 141-144 (shown as schematic blocks) are disposed in the non-display area 102. The connection structures are used to transfer the data lines D1-D4 from the second metal layer to a first metal layer, and thus pitches between the data lines D1-D4 and the touch sensing lines S1-S4 can be reduced. In other embodiments, the connection structures 141-144 may be disposed above the touch sensing lines S1-S4 by a third metal layer, which is not limited in the invention.

Figure 2:
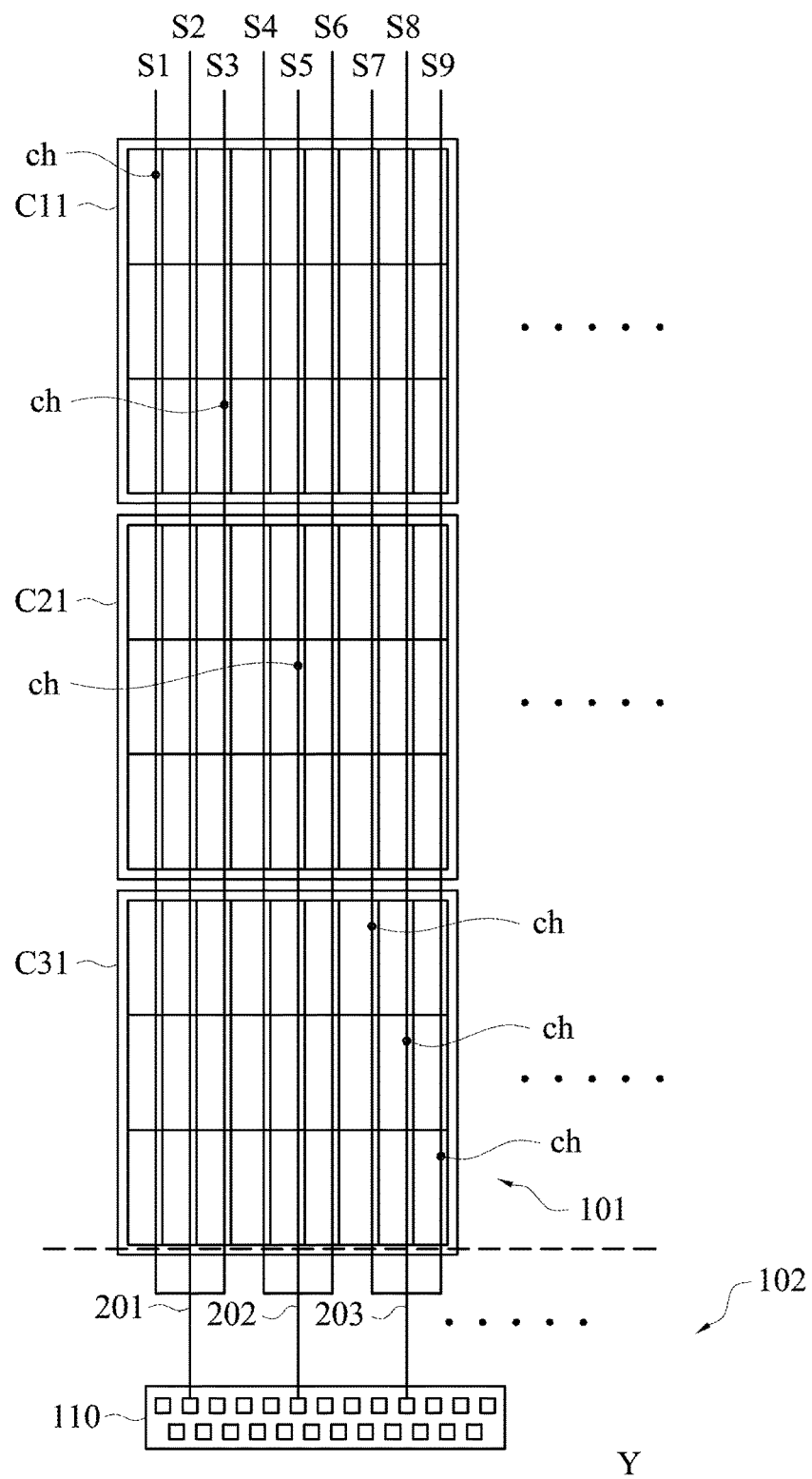
FIG. 2 is a schematic diagram illustrating a connection between the touch sensing line and a driving circuit in accordance with an embodiment.

In FIG. 1, each touch electrode corresponds to four pixel structures. However, each touch electrode may correspond to more or fewer pixel structures in other embodiments. In addition, the number of the data lines D1-04 is equal to the number of the touch sensing lines S1-S4 in FIG. 1. However, in general, each pixel structure (i.e. a sub-pixel) renders only one color, and three sub-pixels constitute one pixel. The three sub-pixels are generally arranged along the X direction, and therefore the resolution of the pixel structures along the X direction is greater than that along the Y direction. For example, a 5-inch display panel including 720×3 (X direction)×1280 (Y direction)=1,843,200 pixel structures is regarded as an HD resolution display panel. In some embodiments, at least two touch sensing lines may connect to each other in the display area 101 or non-display area 102 and the touch sensing lines are electrically connected to one touch pad in the driving circuit 110 through a conductive line. For example, referring to FIG. 2, FIG. 2 is a schematic diagram illustrating a connection between the touch sensing line S1-S3 and a driving circuit 110 in accordance with an embodiment. For simplification, the data lines and the scan lines are not shown in FIG. 2. In the embodiments of FIG. 2, there are 27 pixel structures arranged in 3 rows and 9 columns in each touch electrode C11, C21, C31. Two touch sensing lines S1, S3 of the touch sensing lines S1-S3 are electrically connected to the touch electrode C11 through two contact holes ch. The touch sensing lines S1-S3 are connected to each other in the non-display area 102 and then connected to one touch pad through a conductive line 201. One of the touch sensing lines S4-S6 electrically connects to the touch electrode C21 through one contact hole ch, and the touch sensing lines S4-86 connect to each other in the non-display area 102, and then connect to one touch pad through a conductive line 202. Three of the touch sensing lines S7-S9 electrically connect to the touch electrode C31 through three contact holes ch, and the touch sensing lines S7-S9 connect to each other in the non-display area 102, and then connect to one touch pad through a conductive line 203. The number of touch sensing lines to which each touch electrode is electrically connected is not limited in the invention. For example, if there are five touch sensing lines passing through one touch electrode, then this touch electrode may be electrically connected to any number of touch sensing lines among these five touch sensing lines.

Figure 3A:
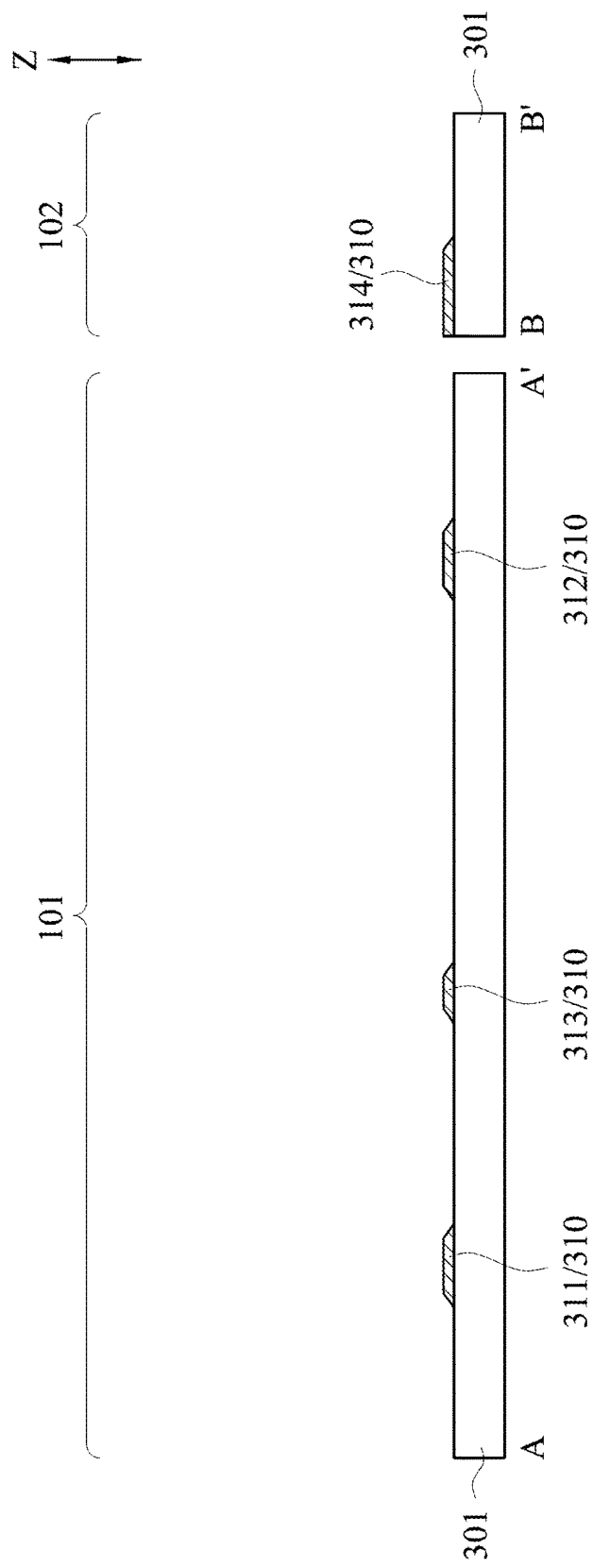
FIG. 3A, FIG. 4A, FIG. 5A, FIG. 6A, FIG. 7A, and FIG. 8A are top views of intermedia steps for manufacturing a pixel structure in accordance with an embodiment.
Figure 3B:
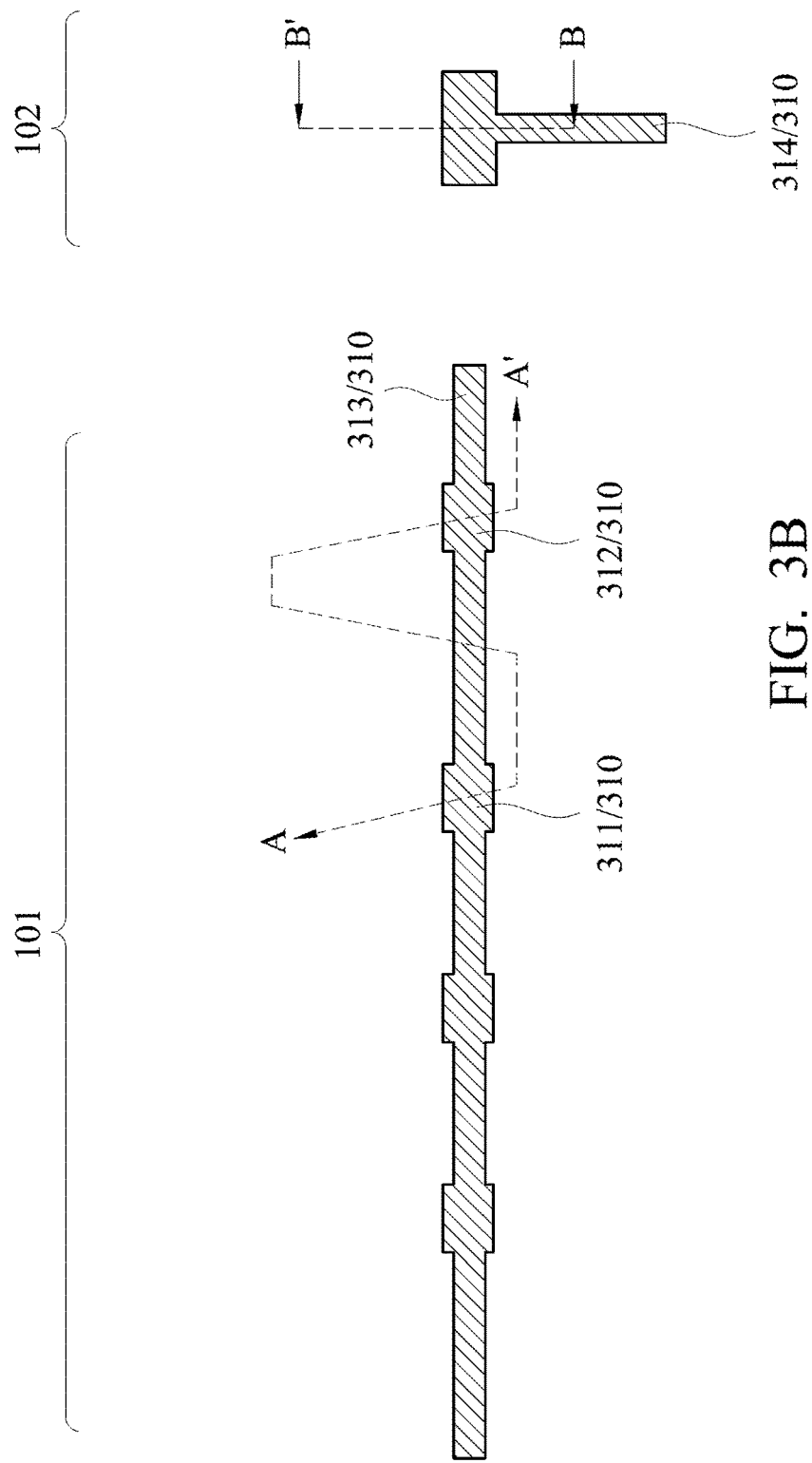
FIG. 3B, FIG. 4B, FIG. 5B, FIG. 6B, FIG. 7B, and FIG. 8B are cross-sectional views of intermedia steps for manufacturing the pixel structure in accordance with an embodiment.

FIG. 3A to FIG. 8A are top views of steps for manufacturing a pixel structure in accordance with an embodiment. FIG. 3B to FIG. 8B are cross-sectional views of steps for manufacturing the pixel structure in accordance with the embodiment. Referring to FIG. 3A and FIG. 3B, one pixel structure (sub-pixel) is identified in the display area 101, and one connection structure (e.g. the connection structure 141 of FIG. 1, or a connection structure on one scan line for transferring the scan line from the first metal layer to the second metal layer, or a connection structure for connecting a gate of an electrostatic discharge unit to the source or the drain) is identified in the non-display area 102. FIG. 3A shows two cross-sectional views respectively along cross-sectional lines AA' and BB' of FIG. 3B. Z direction is perpendicular to the substrate 301. FIG. 3B is a top view of the schematic diagram of the substrate 301 when viewed from the Z direction. A method for manufacturing the display panel includes the following steps. First, a substrate 301 is provided. The substrate 301 may be a glass substrate, a plastic substrate such as Polymethylmethacrylate (PMMA), Polycarbonate (PC), Cyclo Olefin (Co)-polymers (COP), Polyethylene terephthalate (PET) or a film substrate such as Polyimide with a thickness of 3-35 ($\mu$m). Next, a first photolithography process is performed on the substrate 301 to form a patterned first conductive layer (may be metal or nonmetal) such as a metal layer 310 (also referred to a first metal layer). The metal layer 310 may be a single metal layer or a stack of multiple metal layers, which is not limited in the invention. In the display area 101, the metal layer 310 includes gates 311, 312 and a scan line 313. In the non-display area 102, the metal layer 310 includes a conductive line 314.

Note that "a layer" described in the disclosure may indicate a complete film or a patterned layer on which one or more etching process is performed to form features or openings.

Figure 4A:
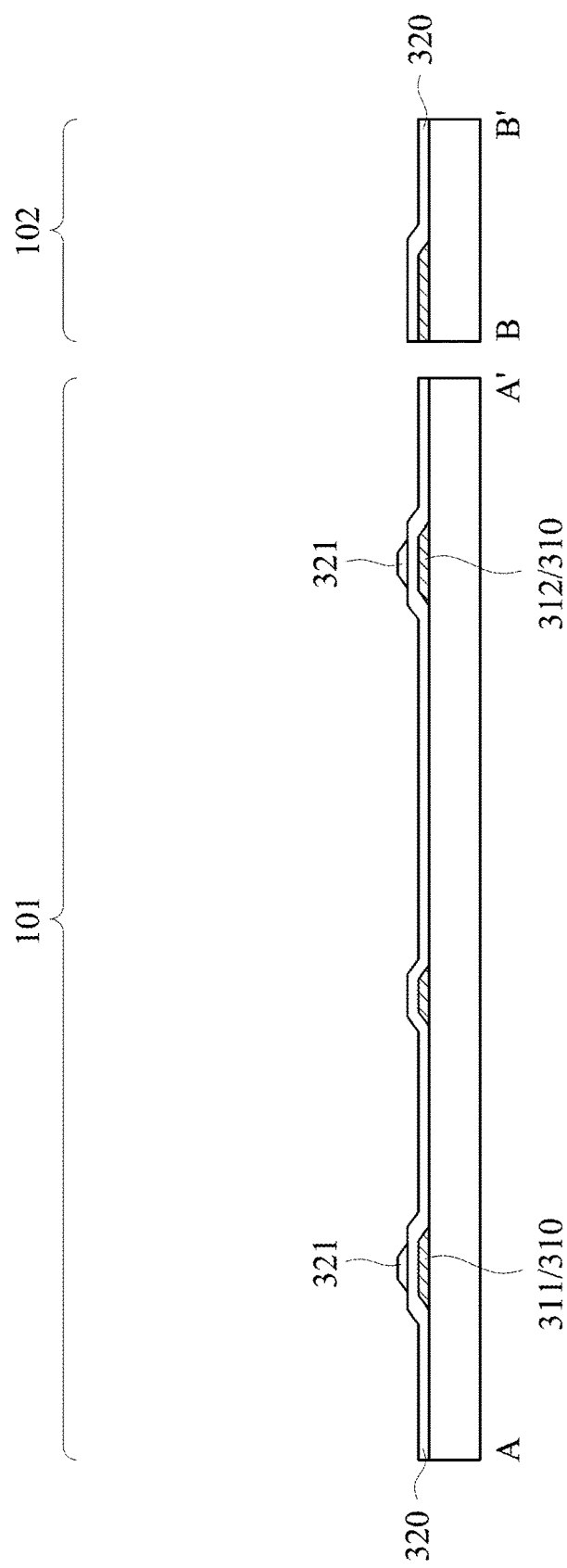
Figure 4B:
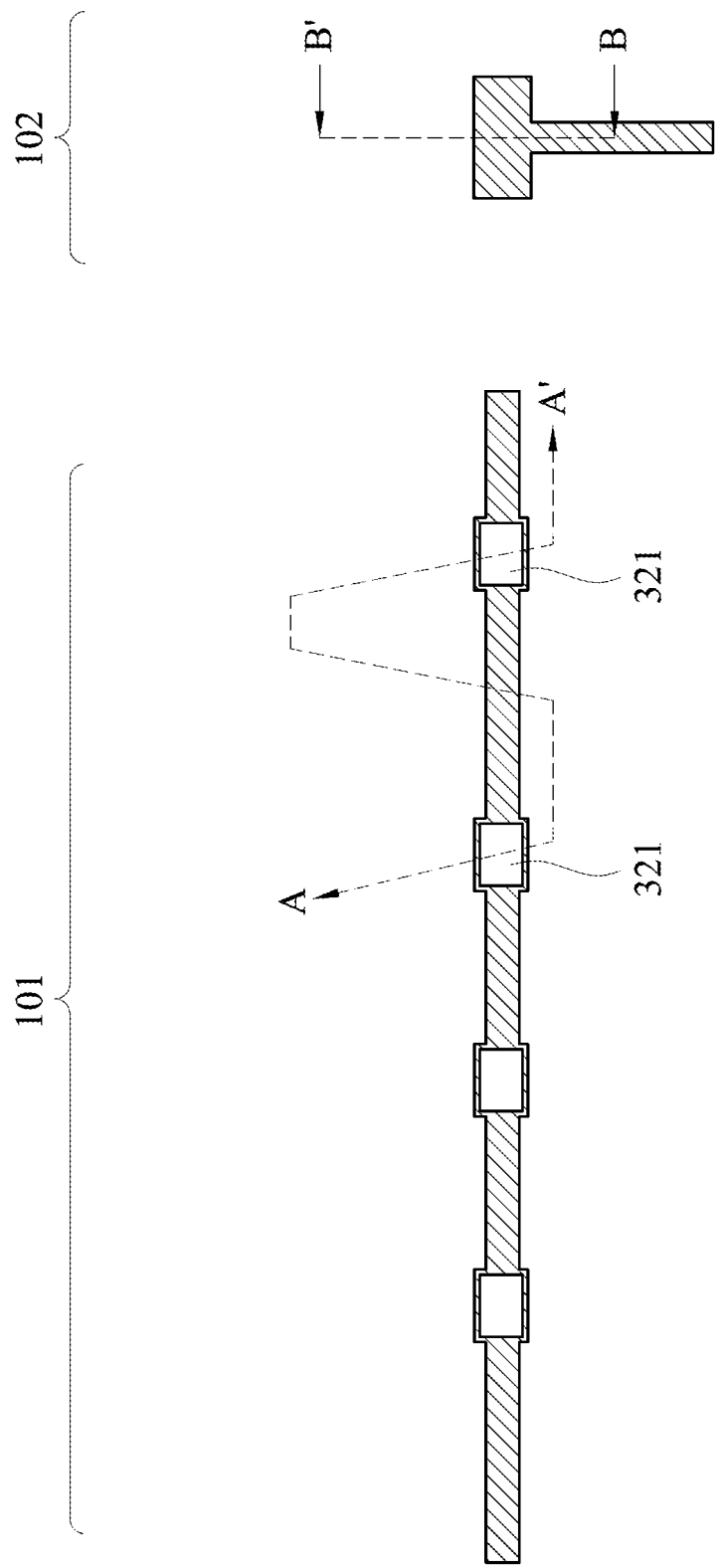

Referring to FIG. 4A and FIG. 4B, an insulation layer 320 (also referred to as a first insulation layer) is formed on the substrate 301 and the metal layer 310, and a patterned semiconductor layer 321 (i.e. second photolithography process) is formed on the insulation layer 320. The semiconductor layer 321 of FIG. 4A is just for illustration. In other embodiments, an ohmic contact layer is disposed on the semiconductor layer 321, and the ohmic contact layer and the semiconductor layer are formed by the same photolithography process. The semiconductor layer 321 serves as a channel of the thin film transistor and is at least partially overlapped with the gates 311, 312. The semiconductor layer 321 may be formed by amorphous silicon (a-Si) or an oxide semiconductor such as indium gallium zinc oxide (IGZO). The chemical formula of IGZO may be $In_2$-$xM_xO_3(Zn_{1-y}O)F$, where M denotes boron (B), aluminum (Al), or gallium (Ga); $0 \leq x \leq 2$; $0 \leq y \leq 1$; and $F=0$-$6$. For example, when $x=1$, $M=Ga$, $y=0$, and $F=1$, the formula of IGZO is $InGaZnO_4$. Besides, the shape of the semiconductor layer 321 in FIG. 4B is just an example, and the semiconductor layer 321 may have any shape in other embodiments.

Note that the term "overlap" mentioned in all embodiments of the specification means an overlapping viewed from a direction perpendicular to the substrate 301 (i.e. Z axis). For example, if "a first unit is at least partially overlapped with a second unit" is written, it means the first unit is at least partially overlapped with the second unit when viewed from the direction perpendicular to the substrate 301 (i.e. Z axis along a normal vector of a top surface of the substrate 301). In other words, a projection of the first unit onto the substrate 301 is at least partially overlapped with a projection of the second unit onto the substrate 301. If "the first unit is overlapped with the second unit" is written, it means that the first unit may be partially overlapped with the second unit, or the first unit may be completely overlapped with the second unit when viewed from the direction perpendicular to the substrate 301. Furthermore, the phrase "first unit covers second unit" mentioned in the specification means that the first unit is above the second unit and the first unit is at least partially overlapped with the second unit from a top view which is viewed from the direction perpendicular to the substrate 301. In the invention, the first unit and the second unit may be a transparent electrode, an insulation layer, a metal layer, an opening, a touch sensing line, a data line, a scan line, etc.

Figure 5A:
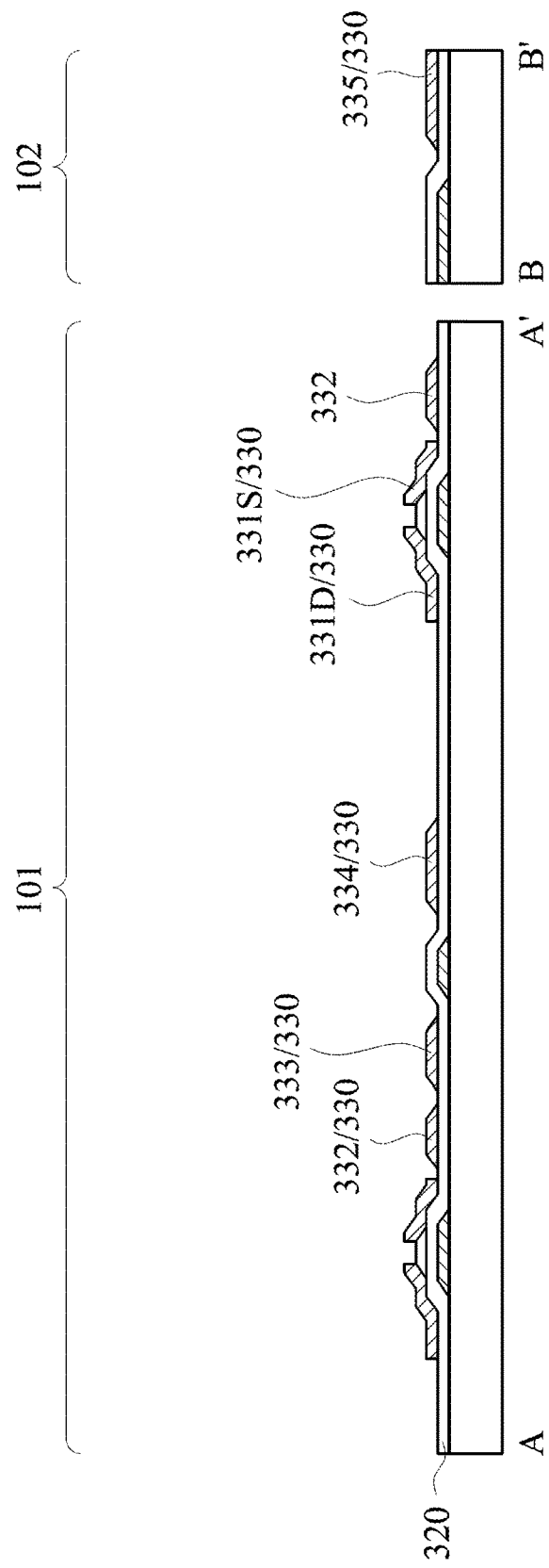
Figure 5B:
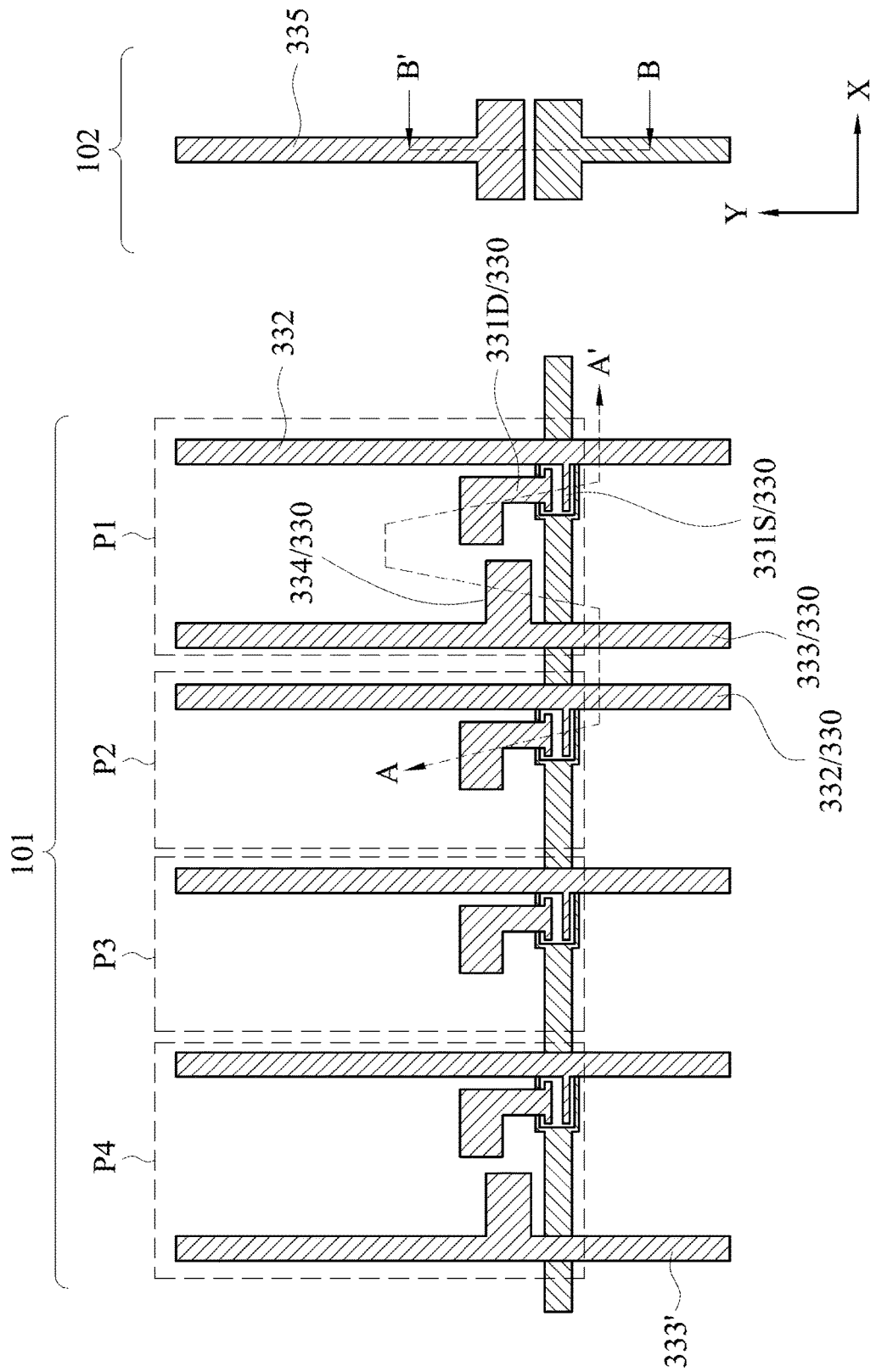

Referring to FIG. 5A and FIG. 5B, a patterned second conductive layer (may be metal or nonmetal) such as a metal layer 330 (also referred to as a second metal layer) is formed on the insulation layer 320 by a third photolithography process. The metal layer 330 may be a single metal layer or multiple metal layers stacked with each other, which is not limited in the invention. In the display area 101, the metal layer 330 includes a drain 331D, a source 331S, a data line 332, a touch sensing line 333 and an extending portion 334. In the non-display area 102, the metal layer 330 includes a conductive line 335. The touch sensing line 333 and the data line 332 are formed by the same process, and the touch sensing line 333 locates between two adjacent data lines 332. That is, the touch sensing line 333 is disposed adjacent to the data line 332 and on the first insulation layer 320. The extending portion 334 is extended from the touch sensing line 333 and can also be regarded as a portion of the touch sensing line 333. In some embodiments, if the touch sensing line 333 is wide enough or is not required to electrically connect to the common electrode, then the extending portion 334 may be canceled. The width of the touch sensing line 333 is equal to the width of the data line 332 in this embodiment, but the width of the touch sensing line 333 may be greater than that of the data line 332 in some embodiments for the sake of resistance match, and thus the resistance of the touch sensing line 333 would not be too large to affect the touch detection. FIG. 5B shows that the touch sensing line 333 in the pixel structure P1 is adjacent to the data line 332 in the next pixel structure P2. In the embodiments, one touch sensing line is disposed in every three pixel structures in a row along X direction. For example, one touch sensing line 333 is disposed in the pixel structure P1, but no touch sensing line is disposed in the pixel structures P2, P3, and a touch sensing line 333' is disposed in the pixel structure P4. In some other embodiments, one touch sensing line is disposed in every pixel structure, or one touch sensing line is disposed in every multiple pixel structures, which is not limited in the invention. In other words, the ratio of the data lines 332 to the touch sensing lines 333 is M:N, where M is not less than N. In the embodiment, the ratio of the data lines 332 to the touch sensing lines 333 is 3:1, and that is, three data lines 332 and one touch sensing line 333 are disposed in a single pixel (including pixel structures P1-P3) as shown in FIG. 5B. However, the invention is not limited thereto, the ratio M:N may be 1, 3/2, or any other suitable number which may be adjusted according to the design of the display panel. The touch sensing lines 333 in this embodiment means the signal lines that actually receive touch sensing signals. Some floating or dummy signal lines parallel with the touch sensing lines 333 would not be regarded as touch sensing lines 333. In addition, the pixel structure with a touch sensing line passing through may not have the extending portion 334, which depends on the design requirement.

Figure 6A:
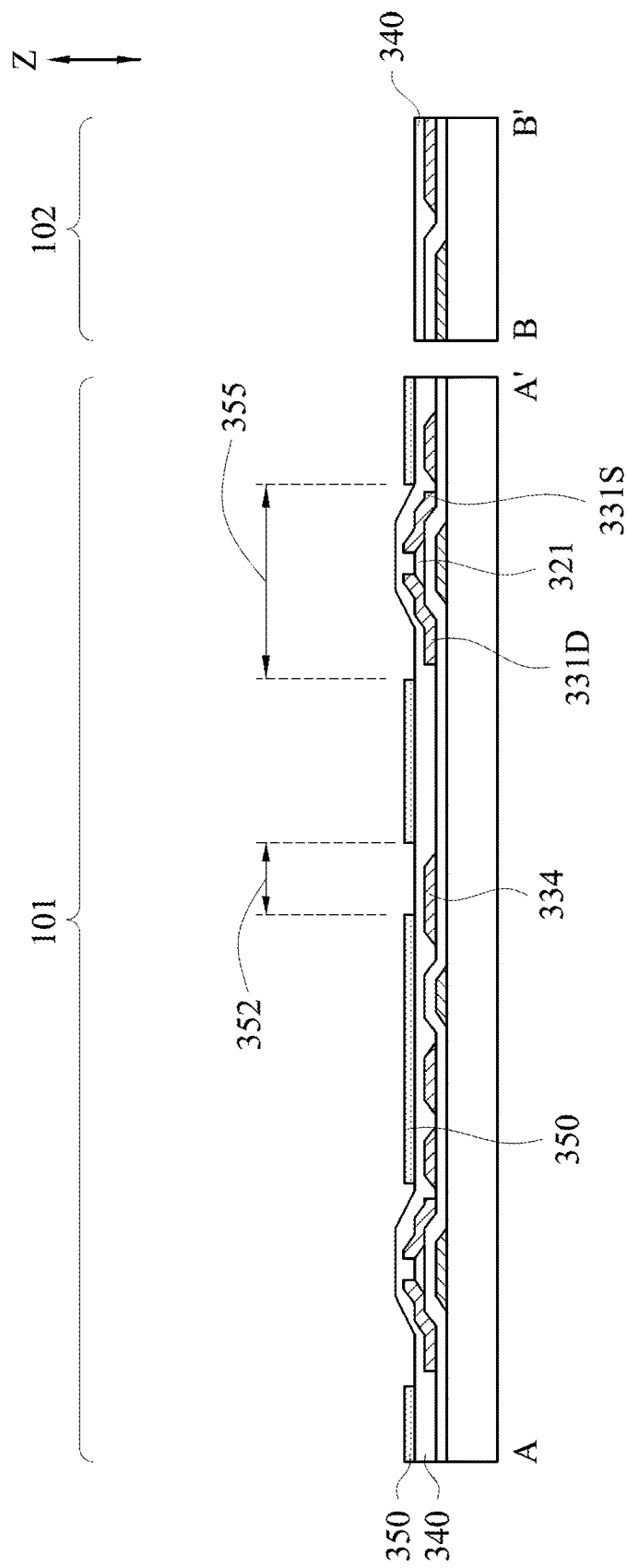
Figure 6B:
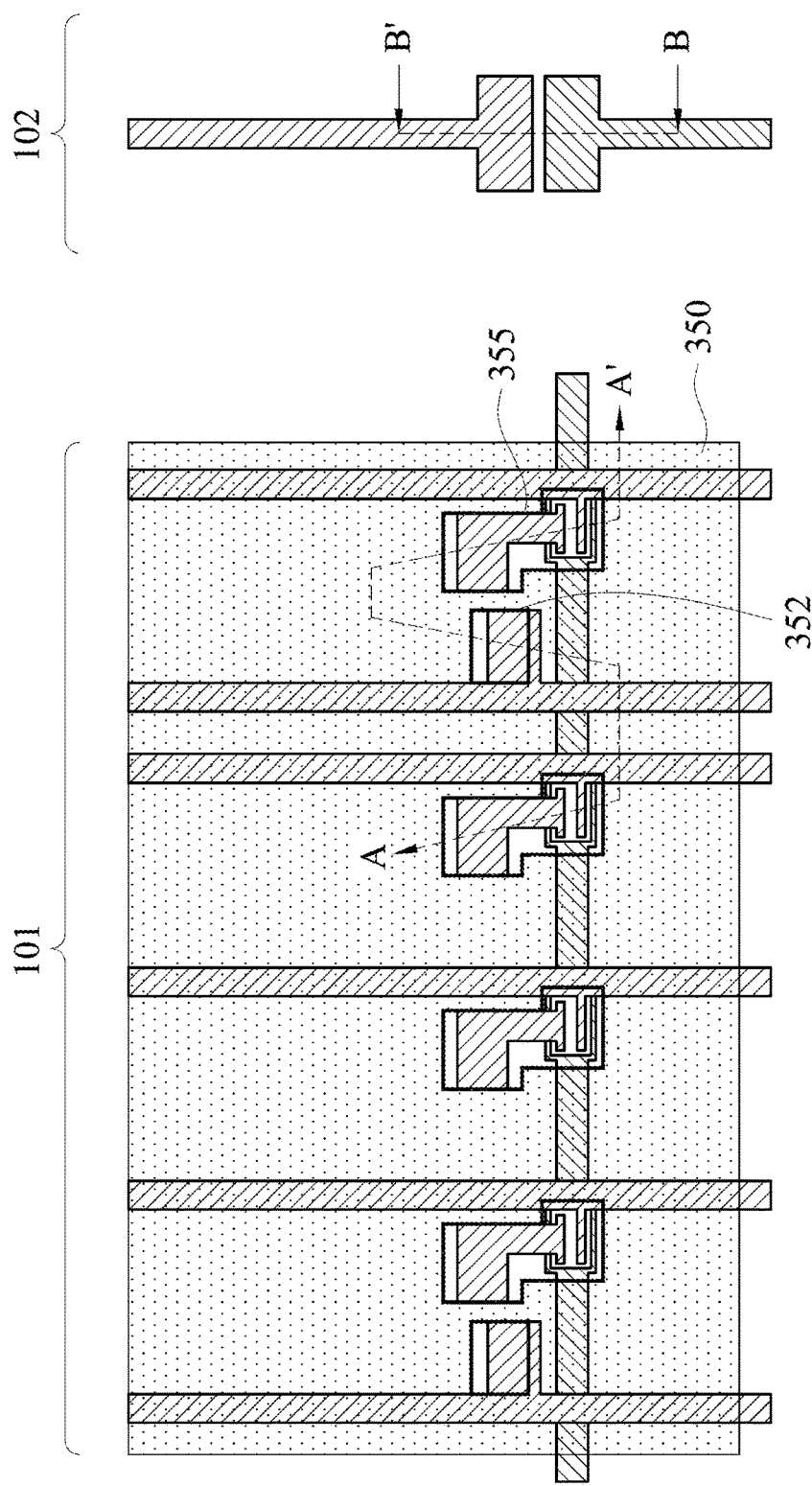

Referring to FIG. 6A and FIG. 6B, an insulation layer 340 (also referred to as a second insulation layer) is formed on the insulation layer 320 and the metal layer 330, and a patterned transparent electrode 350 (also referred to as a first transparent electrode or a common electrode) is formed on the insulation layer 340 by a fourth photolithography process. The transparent electrode 350 includes an opening 352 (also referred to as a second opening) and an opening 355 (also referred to as a fifth opening). When viewed from the direction (Z direction) perpendicular to the substrate 301, the opening 355 is at least partially overlapped with the drain 331D, the semiconductor layer 321 and the source 331S. In this embodiment, the opening 352 is partially overlapped with the extending portion 334, but in other embodiment, the opening 352 may be completely overlapped with the extending portion 334. In some embodiments, the area of the opening 355 is larger than that of the opening 352, and that is to say, the area of the second opening 352 is smaller than that of the fifth opening 355. In other embodiments, the touch sensing line 333 is partially overlapped with the opening 352, and the extending portion 334 is deleted. The purpose of forming the opening 355 is to reduce an induced current in the transparent electrode 350 (i.e. the common electrode or a pixel electrode) and in the semiconductor layer 321. When the induced current in the semiconductor layer 321 is in an allowable range, a leakage current of the thin film transistor is reduced when the thin film transistor is turned off, and thus the problems of uneven brightness and cross-talk of the display panel are addressed.

Figure 7A:
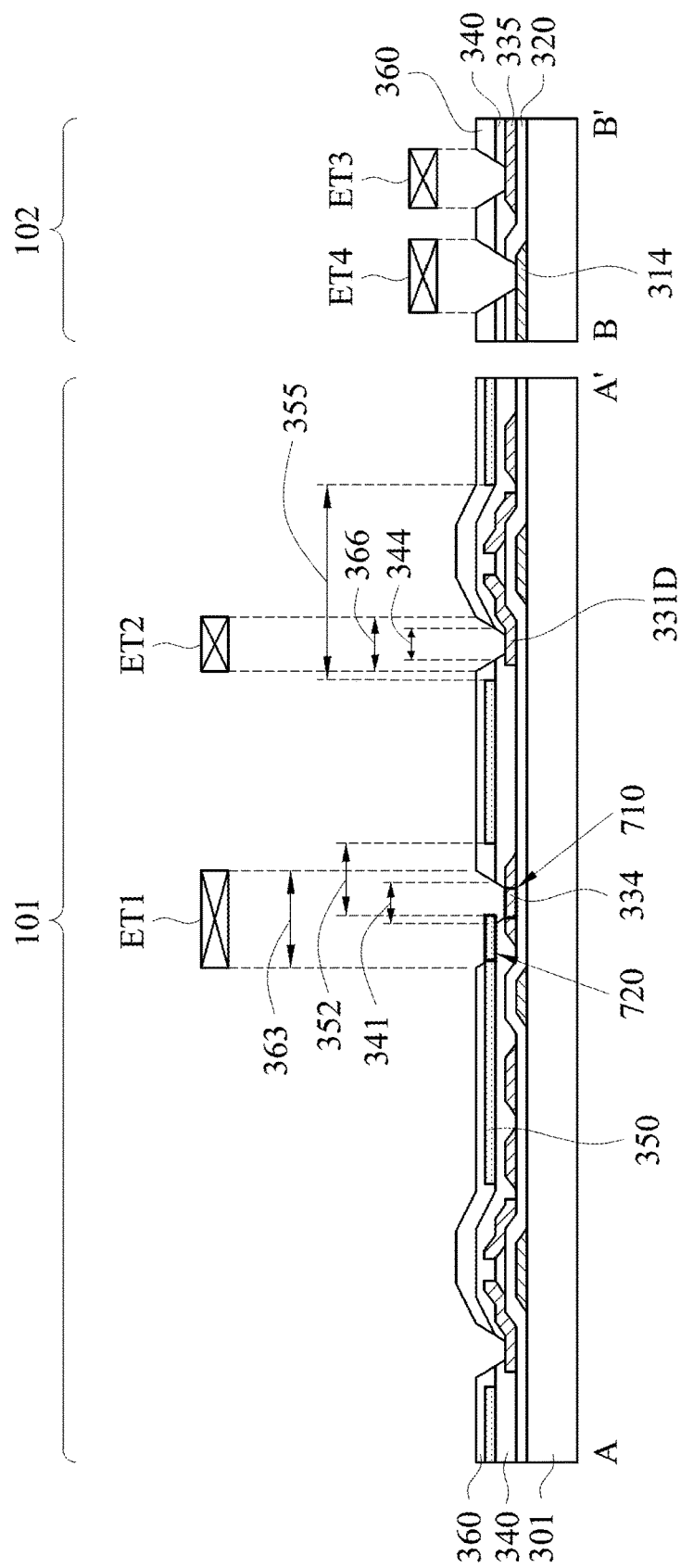
Figure 7B:
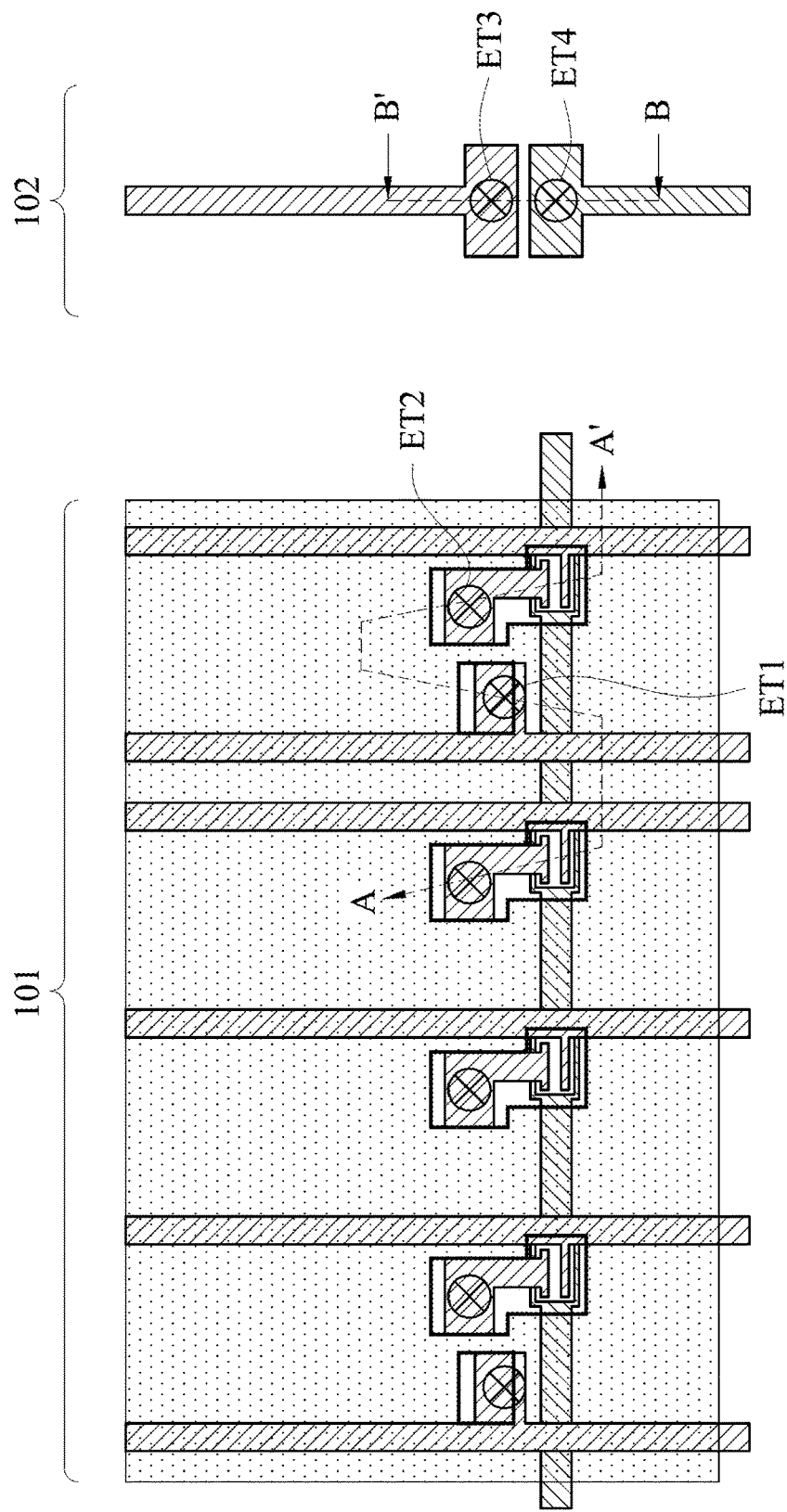

Next, referring to FIG. 7A and FIG. 7B, an insulation layer 360 (also referred to a third insulation layer) is formed on the transparent electrode 350. In the non-display area, an etching process corresponding to the material of the insulation layer 360 and the insulation layer 340 is performed in the etching area ET3, ET4 so as to form openings in the insulation layers 360, 340, and 320 to expose the conductive lines 314, 335.

In the display area 101, a fifth photolithography process is employed to form an opening 363 (also referred to as a third opening) and an opening 366 (also referred to a sixth opening) in the insulation layer 360 and an opening 341 (also referred to as a first opening) and an opening 344 (also referred to a fourth opening) in the insulation layer 340. In other words, an etching process corresponding to the material of the insulation layer 360 and the insulation layer 340 is performed in the etching areas ET1, ET2 so as to form the opening 363 and the opening 366 in the insulation layer 360, and form the opening 341 and the opening 344 in the insulation layer 340. In this embodiment, a dry etching is preferred, but a wet etching may be adopted. In detail, referring to FIG. 7A, the opening 366 is overlapped with the etching area ET2, the opening 344 is overlapped with the opening 355 and the opening 366, and the opening 344 exposes a portion of the drain 331D. In some embodiments, the opening 344 is further overlapped with the semiconductor layer 321. In addition, when viewed from the direction perpendicular to the substrate 301, the opening 363 is overlapped with the etching area ET1, and an area of the opening 363 is partially overlapped with an area of the opening 352. A portion of the transparent electrode 350 is exposed in the area of the opening 363. Herein, the transparent electrode 350 exposed by the third opening 363 is defined as a second connection part 720, and a portion of the metal layer 330 (i.e. extending portion 334/touch sensing line 333) exposed by the first opening 341 is defined as a first connection part 710. In the area of the opening 352, a portion of the insulation layer 360 which is not overlapped with the opening 363 is in direct contact with the insulation layer 340. The area that the opening 363 overlaps with the opening 352 is at least partially overlapped with an area of the opening 341. From another aspect, when etching the insulation layers 360, 340 in the etching area ET1, the transparent electrode 350 exposed by the third opening 363 (i.e. the second connection part 720) serves as a mask layer. For example, the material of the insulation layers 360, 340 is SiOx, SiNy, or a stacked layer thereof. The material of the transparent electrode 350 may be, for example, ITO. When a dry etching process is adopted, the second connection part 720 of the transparent electrode 350 serves as a mask to shield the insulation layer 340 beneath the second connection part 720 from the non-isotropic physical bombardment of the dry etching. However, the insulation layer 340 may be etched while the opening 341 (also referred to as the first opening) is formed by the dry etching process. The portion of the first transparent electrode 350 exposed by the third opening 363 (i.e. the second connection part 720) may partially overlap with the first opening 341 when viewed from the direction perpendicular to the substrate 301 as shown in FIG. 7A. In general, during the etching process forming the opening 341 (i.e. first opening), the insulation layer 340 (i.e. second insulation layer) may still etched along a direction parallel with the substrate (i.e. X or Y direction), resulting in that a phenomenon of "under cutting" occurs beneath the transparent electrode 350 (first transparent electrode). In an ideal situation, the phenomenon of "under cutting" may not occur. For example, when thickness of the insulation layer 340 is in the range of 1000-6000 Angstrom (A), the "under cutting" may exist slightly or even not exist. When the wet etching process is adopted, the isotropic etching toward the insulation layer 340 may cause obvious phenomenon of "under cutting" beneath the transparent electrode 350 (second connection part 720), resulting in that the top surface and some of the bottom surfaces of the second connection part 720 are exposed. In this embodiment, the etching area ET1 (i.e. area of the opening 363) overlaps with the extending portion 334 and the opening 352, and thus the opening 341 is formed in the insulation layer 340 to expose a portion of the extending portion 334/touch sensing line 333. Besides, when the phenomenon of "under cutting" occurs, a portion of the second connection part 720 of the first transparent electrode is partially overlapped with the first opening 341.

Figure 7C:
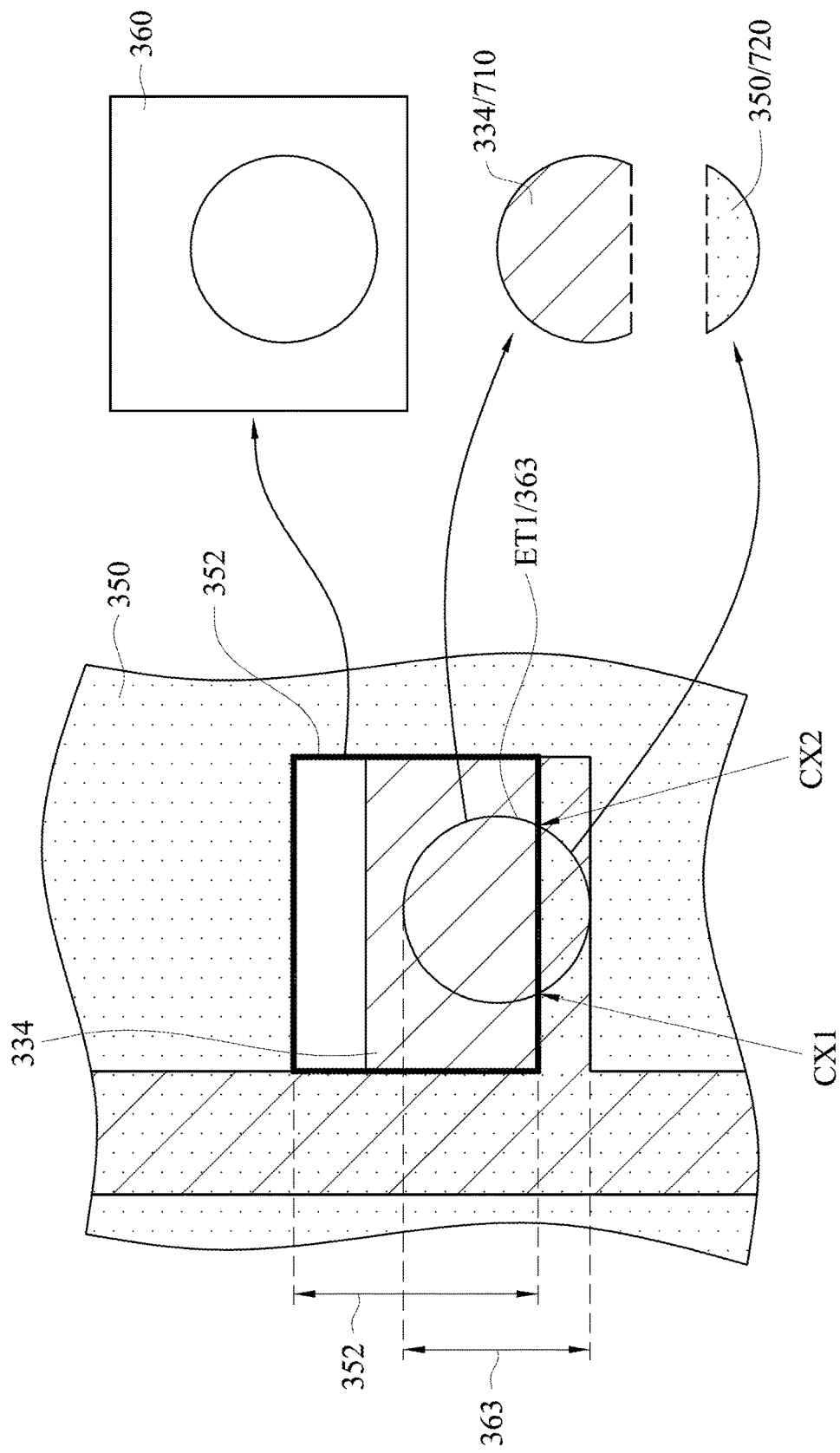
FIG. 7C is an enlarged diagram around an etching area ET1 of FIG. 7B.

Referring to FIG. 7C, FIG. 7C is an enlarged diagram of an area around an etching area ET1 of FIG. 7B. In FIG. 7C, when viewed from the direction perpendicular to the substrate 301, the contour of the opening 363 and the contour of the opening 352 intersect at at least two locations CX1, CX2, and a portion of the contour of the opening 363 locates in the area of the opening 352. Referring to FIG. 7A and FIG. 7C, from a top view (viewed from Z axis), an area around the etching area ET1 includes three different materials based on the ranges of the opening 352 and the opening 363. First, the material not in the opening 363 is the insulation layer 360; second, the material in the both of the opening 352 and the opening 363 is the extending portion 334/touch sensing line 333; third, the material in the opening 363 but not in the opening 352 is the transparent electrode 350 (i.e. second connection part 720). In FIG. 7C, the extending portion 334/touch sensing line 333 exposed by the opening 341 (first opening) is referred to as the first connection part 710, and the transparent electrode 350 exposed by the opening 363 (third opening) is referred to as the second connection part 720. In FIG. 7C, the dash lines of the first connection part 710 and the second connection part 720 represent the locations where "under cutting" may occur.

Figure 8A:
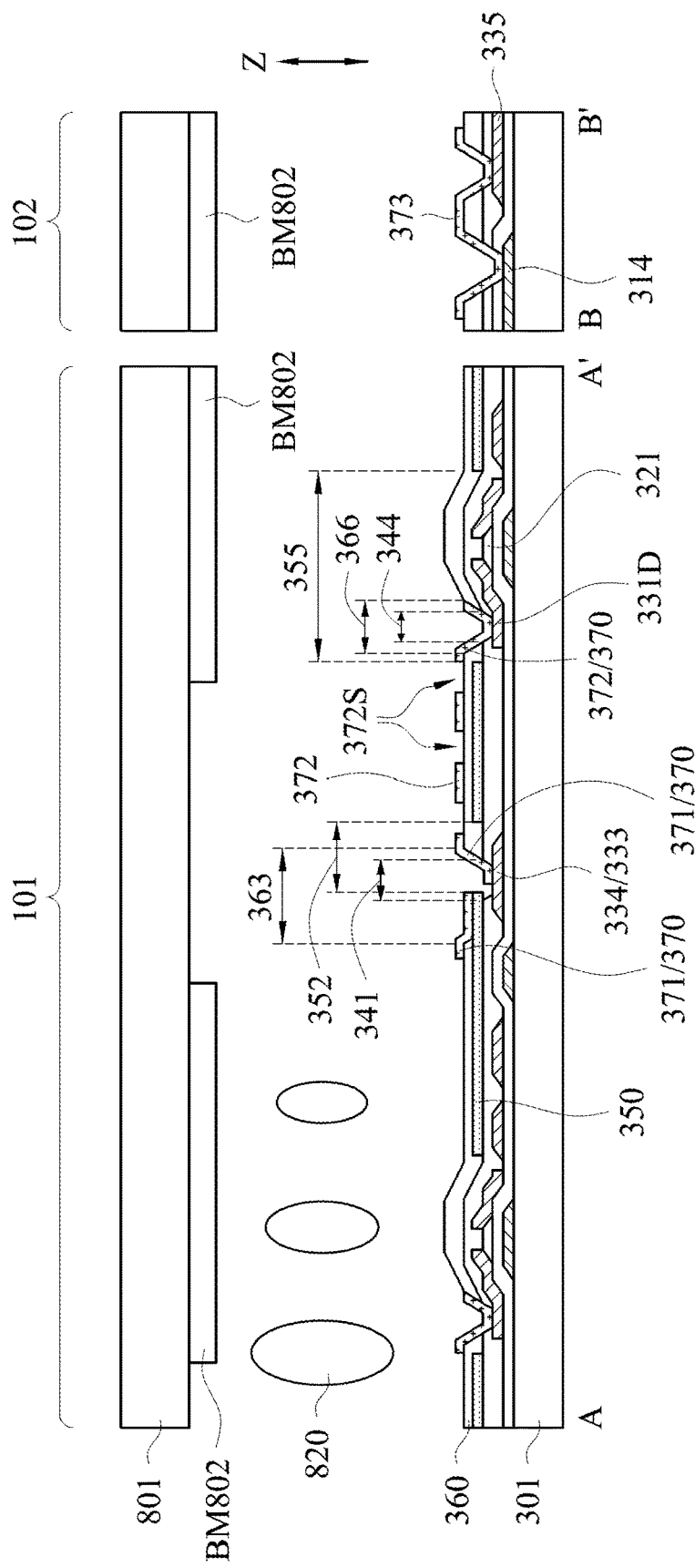
Figure 8B:
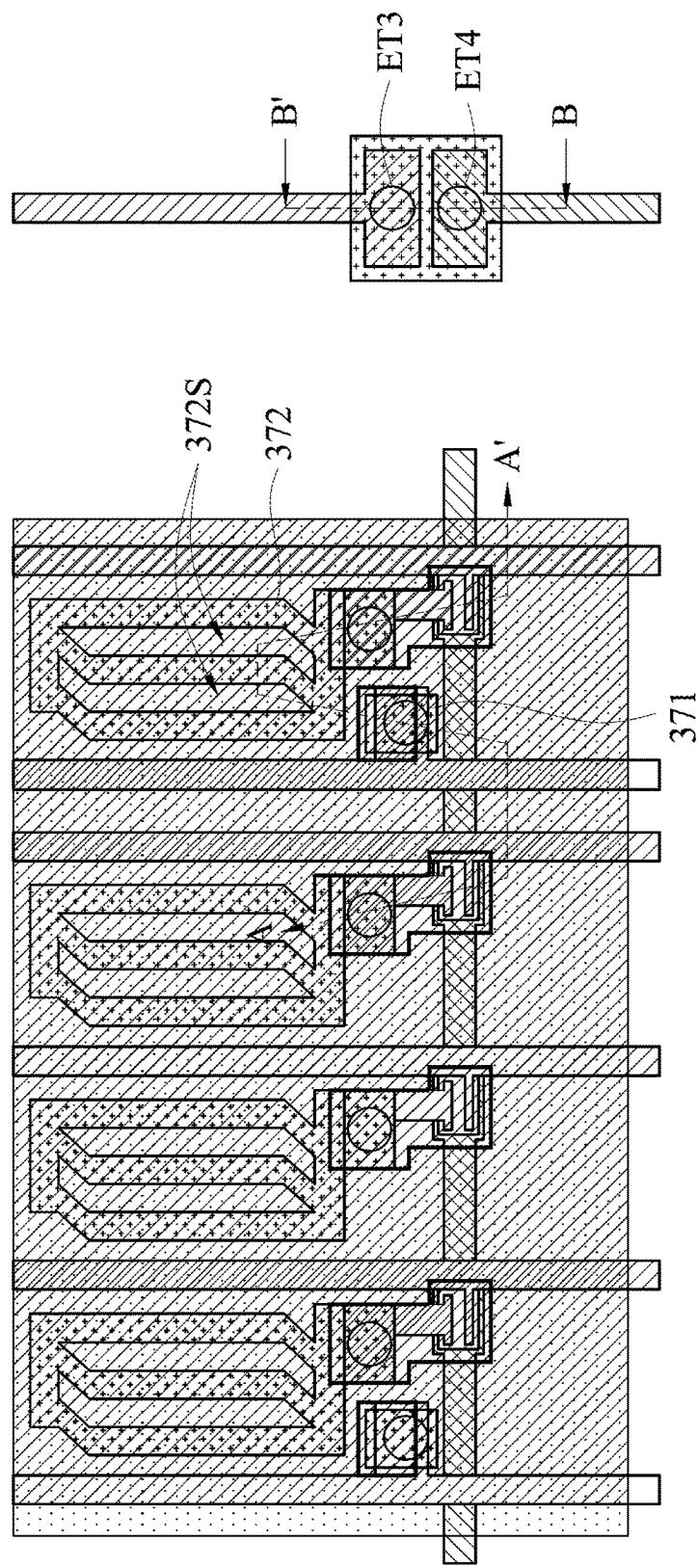

Next, referring to FIG. 8A and FIG. 8B, a patterned transparent electrode 370 is formed on the insulation layer 360 (third insulation layer) by a sixth photolithography process. In the non-display area 102, the transparent electrode 370 includes a connection electrode 373 for electrically connecting the conductive line 314 and the conductive line 335.

Figure 8C:
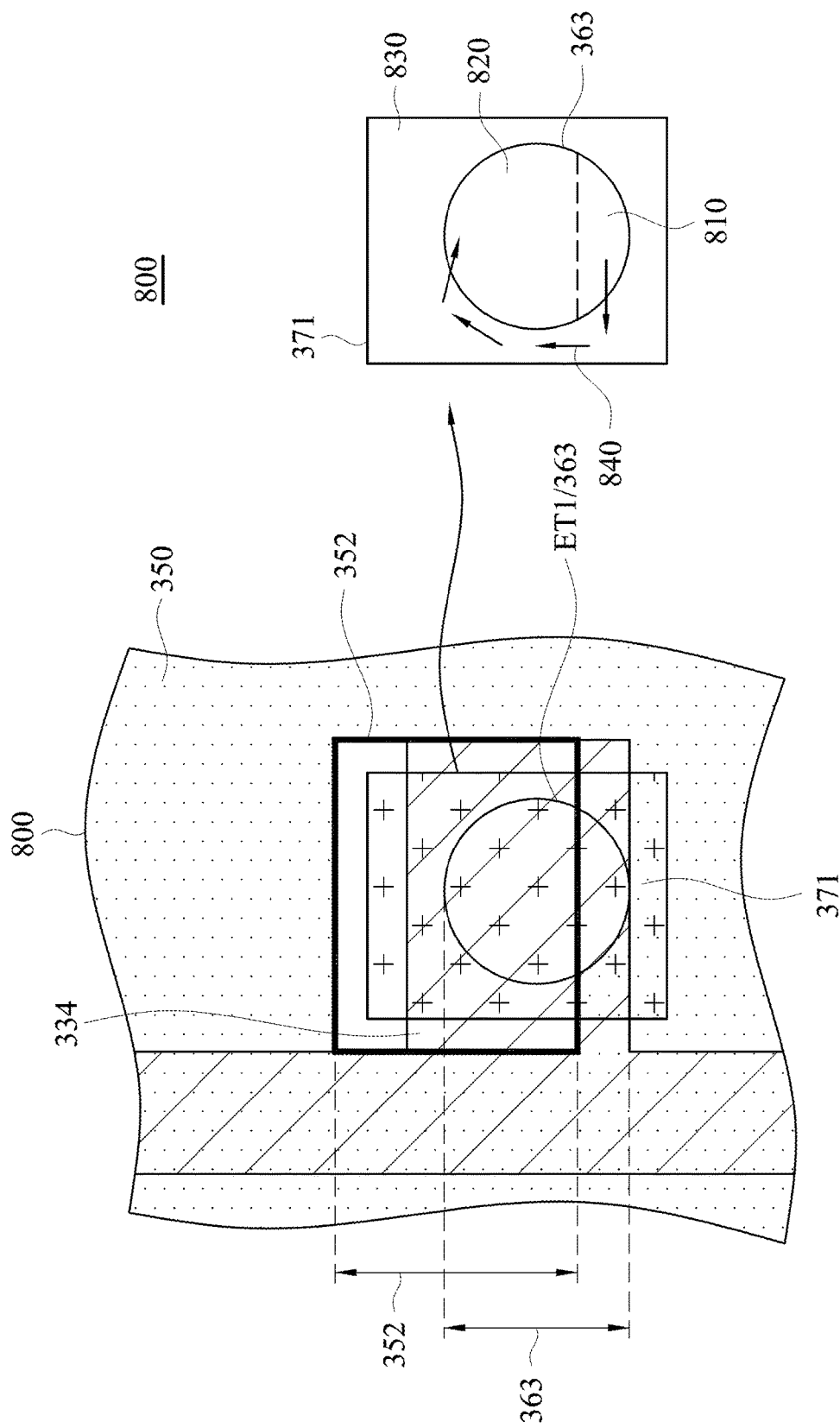
FIG. 8C is an enlarged diagram around an etching area ET1 of FIG. 8B.

In the display area 101, the transparent electrode 370 includes a connection electrode 371 and a pixel electrode 372 (also referred to as a second transparent electrode). The pixel electrode 372 is electrically connected to the drain 331D through the opening 366, the opening 355, and opening 344. In some embodiments, the pixel electrode 372 has a slit pattern, and that means the pixel electrode 372 has one or more slits 372S. For example, there are two slits 372S in this embodiment. In this case, the transparent electrode 350 (i.e. first transparent electrode) serves as the common electrode. The connection electrode 371 electrically connects the transparent electrode 350 to the extending portion 334/touch sensing line 333 through the opening 363, the opening 352, and the opening 341. In detail, FIG. 8C is an enlarged diagram of an area around the etching area ET1 of FIG. 8B, this area is also referred to as a contact structure 800. The contact structure 800 includes a portion or all following units: the connection electrode 371, the third insulation layer 360 (830), the third opening 363, a second connection part 810 of the first transparent electrode 350, the second opening 352 of the first transparent electrode 350, the second insulation layer 340, the first opening 341, the touch sensing line 333/extending portion 334 (first connection part 820 of the second metal layer). Referring to FIG. 7C and FIG. 8C, the area encompassed by the connection electrode 371 covers the opening 363 and is at least partially overlapped with the opening 352. When viewed from the direction perpendicular to the substrate 301 (i.e. the direction of Z axis), the first portion 810 of the connection electrode 371 overlapped with the opening 363 directly contacts the second connection part 720. That is, the first portion 810 of the connection electrode 371 which is in the opening 363 but not in the opening 352 is in direct contact with the second connection part 720; the second portion 820 of the connection electrode 371 partially overlapped with the third opening directly contacts the first connection part 710. That is, the second portion 820 which is in both opening 363 and the opening 352 is in direct contact with the first connection part 710; the third portion 830 of the connection electrode 372, which is not in the opening 363, is on the insulation layer 360 (the third insulation layer). The extending portion 334/touch sensing line 333 overlaps with the third opening 363 and partially overlaps with the second opening 352 from a top view that is perpendicular to the substrate. In particular, the dash line between the first portion 810 and the second portion 820 represent the locations where the phenomenon of "under cutting" may occur. Accordingly, the first portion 810 may not effectively and electrically connect to the second portion 820. However, the first portion 810 and the second portion 820 are both connected to the third portion 830, and therefore the first portion 810 is electrically connected to the second portion 820 through the third portion 830 (along with a conductive path 840 or vice versa). When the phenomenon of "under cutting" occurs, the connection electrode 371 may not be able to effectively and electrically connect the first transparent electrode 350 to the touch sensing line 333. Herein, "not effectively and electrically connected to" means that, for example, the connection electrode 371 is completely cut off/disconnected between the first portion 810 and the second portion 820, or although the connection electrode 371 is not cut off between the first portion 810 and the second portion 820, the thickness of the electrode in a local area, where the dash line is drawn, is too thin, resulting in higher resistance than normal situation. As a result of the embodiment, even the connection electrode 371 is cut off between the first portion 810 and the second portion 820, the extending portion 334/touch sensing line 333 formed by the second metal layer can still be effectively and electrically connected to the transparent electrode 350 (i.e. the touch electrode).

Figure 8D:
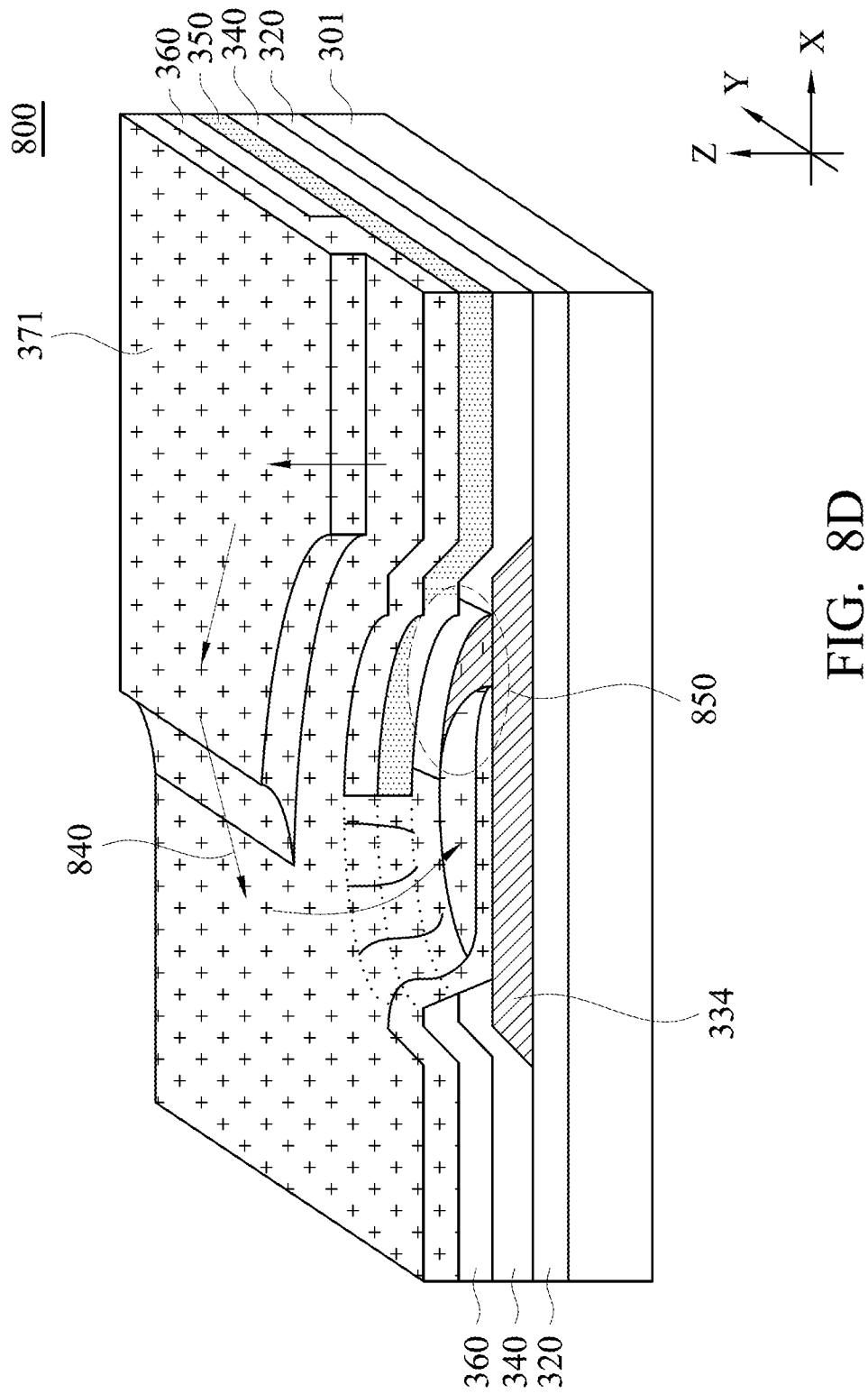
FIG. 8D is a perspective view of a conductive path in a contact structure in accordance with an embodiment.

FIG. 8D is a perspective view of a conductive path in a contact structure in accordance with an embodiment. Referring to FIG. 8C and FIG. 8D, the area 850 of FIG. 8D has the phenomenon of "under cutting", causing that the transparent electrode 350 is not connected to the extending portion 334 in the area 850. However, the transparent electrode 350 can be electrically connected to the extending portion 334 through the conductive path 840. Therefore, referring to FIG. 8C again, in the embodiment, the etching area ET1/opening 363 has to be partially overlapped with the opening 352, and the area that the opening 363 overlaps with the opening 352 has to be partially overlapped with the extending portion 334. In addition, the connection electrode 371 has to cover at least a portion of the opening 363 and at least a portion of the opening 352. In some embodiments, the area of the connection electrode 371 is larger than that of the opening 363 (i.e. the third opening) and covers the opening 363. In some embodiments, the connection electrode 371 covers over half of the opening 363, and at least in contact with the first connection part 710, the second connection part 720 and a portion of the insulation layer 340, 360 in the opening 363.

Based on the embodiment of described above, only six photolithography processes (i.e. FIG. 3A to FIG. 8B) are required to manufacture the array panel including the touch electrodes such as an array panel applied in a Fringe Field Switching (FFS) liquid crystal display panel with embedded touch function. Accordingly, the manufacturing cost is reduced and the yield rate is increased.

Referring to FIG. 8A, the display panel further includes an opposite substrate 801 disposed opposite to the substrate 301. A liquid crystal layer 820 is disposed between the substrate 301 and the opposite substrate 801. The liquid crystal layer 820 may mainly include positive liquid crystal molecules, negative liquid crystal molecules, or the combination of these two liquid crystal molecules. The positive liquid crystal molecule has positive dielectric anisotropy, and the negative liquid crystal molecule has negative dielectric anisotropy. For example, when the liquid crystal layer 820 mainly includes the negative liquid crystal molecules and photo alignment layers (not shown) are disposed on the substrate 301 and the opposite substrate 801, it would be significantly beneficial to suppress ripples generated when the display panel is pressed by an external force.

In a display period of the liquid crystal display panel, the transparent electrode 350 serves as the common electrode, and the electric field between the transparent electrode 350 and the pixel electrode 372 is used to orient the liquid crystal in the liquid crystal layer 820. In this embodiment, the transparent electrode 350 partially covers the extending portion 334/touch sensing line 333. However, in other embodiments, the transparent electrode 350 may not cover the extending portion 334/touch sensing line 333, and that is, the opening 352 is larger to cover the extending portion 334/touch sensing line 333.

Referring to FIG. 7C and FIG. 8C, in some embodiments, a ratio of the area of the second connection part 720 exposed by the opening 363 (i.e. the third opening) to the area of the opening 363 is in a range from 0.1 to 1. In some embodiments, a ratio of the area where the connection electrode 371 contacts the first connection part 710 (also referred to as a first contact area) to the area where the connection electrode 371 contacts the second connection part 720 (also referred to as a second contact area) is in a range from 0.1 to 10.

In the aforementioned embodiments, the material of the substrate 310 may include glass, polymer, polyethylene terephthalate (PET), polycarbonate (PC), polyether sulfone (PES), triacetyl cellulose (TAC), PMMA, polyethylene, COP, polyimide (PI), and a compound material constituted by PC and PMMA, which is not limited in the invention. The material of the transparent electrodes 350, 370 may include indium tin oxide (ITO), indium zinc oxide (IZO), antimony tin oxide (ATO), fluorine tin oxide (FTO) or other conductive and transparent material such as a Nano-metal wire (e.g. nano-silver wire, nano-copper wire).

The metal layer in the specification may be a single layer of aluminum, copper, titanium, tungsten, etc. or a compound layer of molybdenum-aluminum-molybdenum, titanium-aluminum-titanium, titanium-copper-titanium, etc. which is not limited in the invention. On the other hand, the insulation layer in the specification may be silicon nitride, silicon oxide, silicon oxynitride or other suitable insulation layers. Furthermore, one insulation layer shown in the figures may include two or more than two insulation layers stacked with each other with different material. In addition, when "opening to expose" is written in the specification, it means that the unit below is partially exposed, or completely exposed in accordance with the requirement, which is not limited in the invention.

Figure 9A:
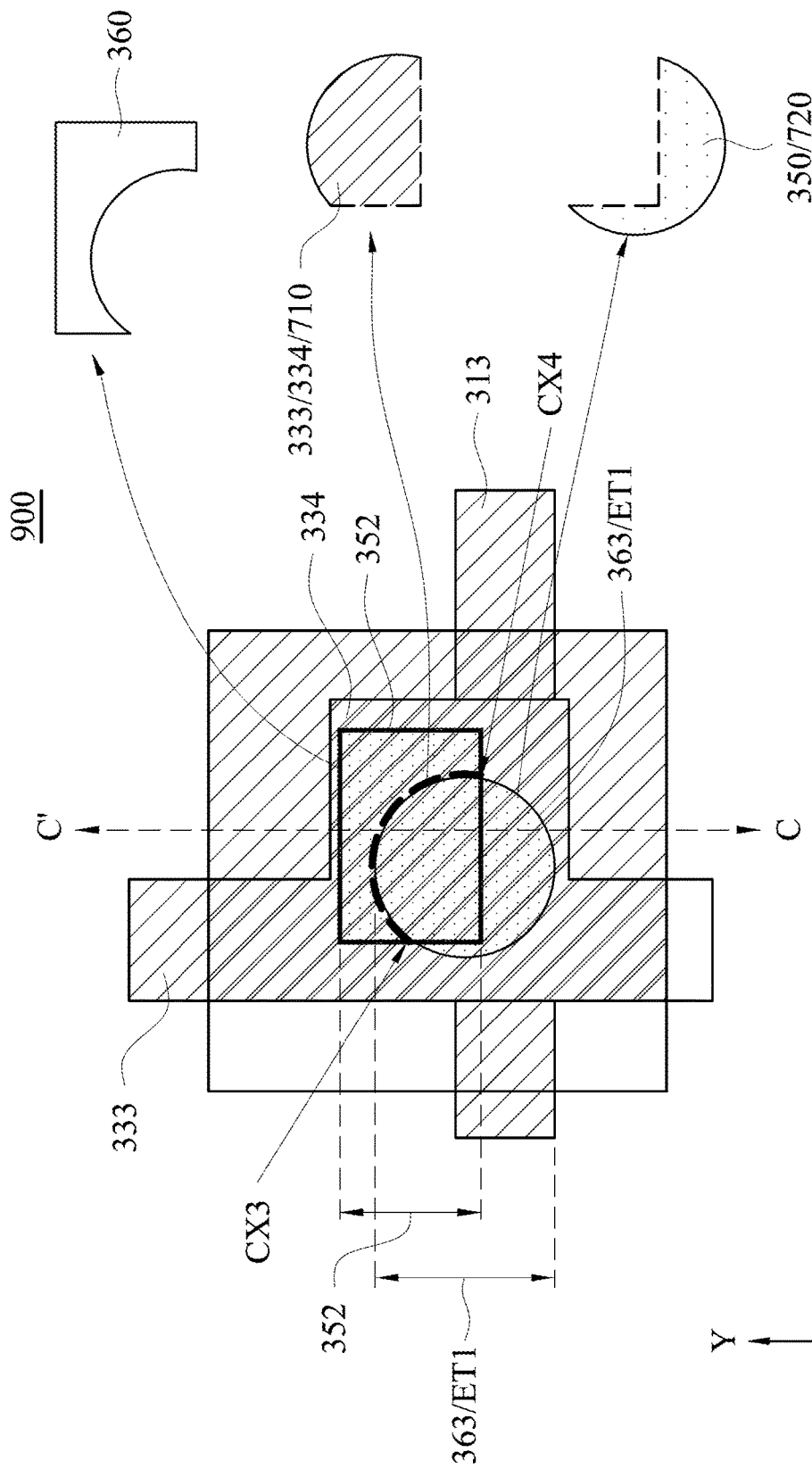
FIG. 9A is an enlarged diagram of the contact structure in accordance with another embodiment.
Figure 9B:
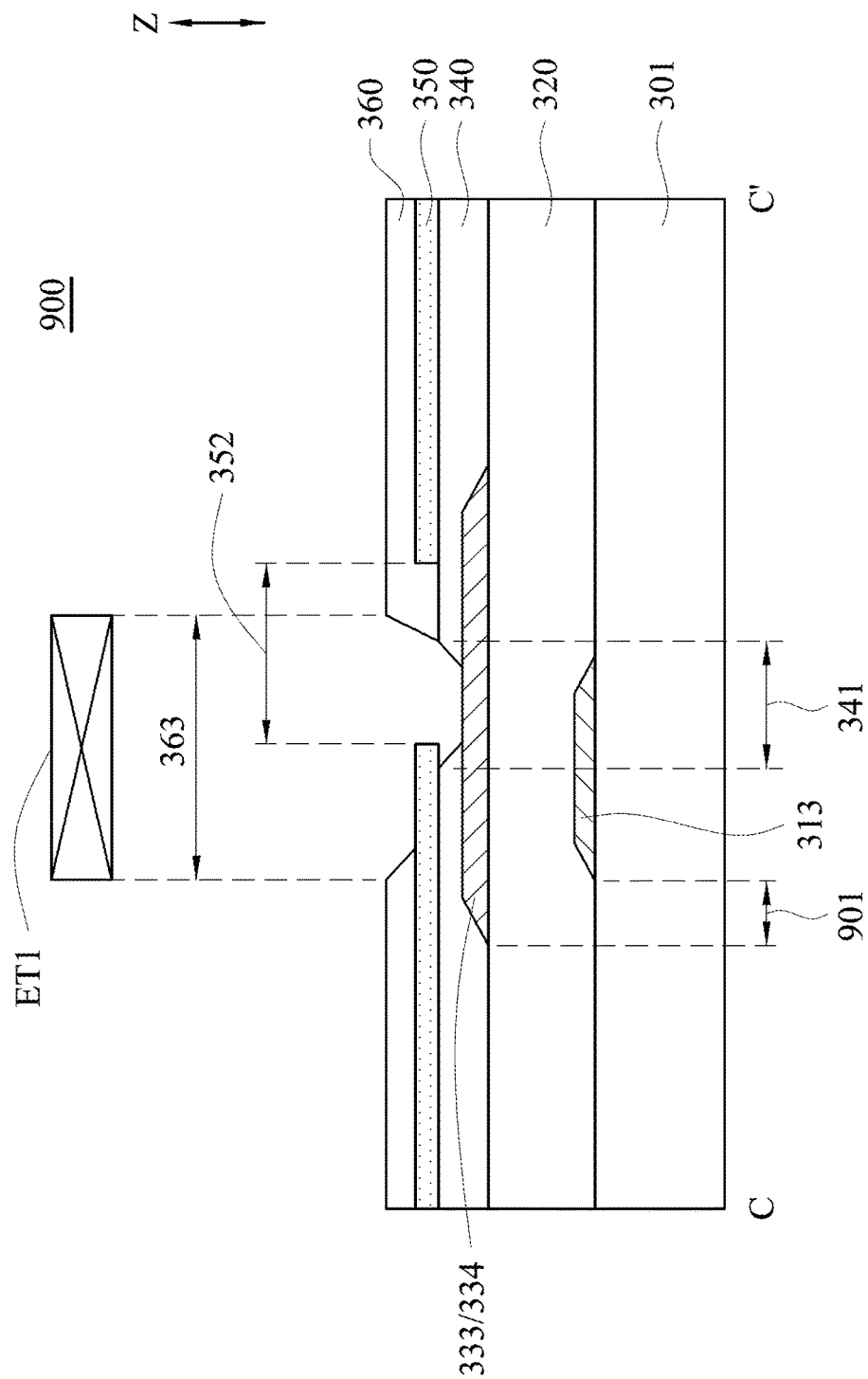
FIG. 9B is cross-sectional view along a cross-sectional line CC' of FIG. 9A.

In the embodiments described above, the extending portion 334 is not overlapped with the scan line 313, but the extending portion 334 may be partially overlapped with the scan line in other embodiments. For example, FIG. 9A is an enlarged diagram showing the contact structure 900 in accordance with another embodiment when it is observed from a top view from the direction perpendicular to the substrate 301 by an equipment such as a microscope. FIG. 9B is cross-sectional view along a cross-sectional line CC' of FIG. 9A. The connection electrode 371 has not been formed in FIG. 9A and FIG. 9B, and therefore they are similar to FIG. 7C and FIG. 7A respectively. For simplification, only a contact structure 900 is illustrated in FIG. 9A and FIG. 9B, and other components (e.g. thin film transistor and pixel electrode) may be referred to FIG. 7A to FIG. 7C and will not be described again. In the embodiment of FIG. 9A and FIG. 9B, the extending portion 334 is partially overlapped with the scan line 313 so as to increase the aperture ratio. In detail, the extending portion 334 completely covers a segment of the scan line 313. The transparent electrode 350 is formed above the extending portion 334. The opening 352 (i.e. the second opening) of the transparent electrode 350 is at least partially overlapped with the extending portion 334. The opening 363 (i.e. the third opening) of the insulation layer 360 (i.e. the third insulation layer) is also overlapped with the extending portion 334. The insulation layer 360 is formed on the transparent electrode 350. The etching area ET1 (i.e. the opening 363 of the insulation layer 360) is overlapped with the scan line 313 when viewed from the direction perpendicular to the substrate 301 within an overlapping area, and at least one of the transparent electrode 350 and the extending portion 334 is within in the overlapping area. Accordingly, when performing the etching process in the etching area ET1, the extending portion 334 and/or the transparent electrode 350 serve as a mask layer for the scan line 313 to prevent the insulation layer 320 from being etched. From another aspect, the extending portion 334, the transparent electrode 350 or the combination thereof completely covers an area where the scan line 313 is overlapped with the etching area ET1. For example, in FIG. 9B, the extending portion 334 is overlapped with the scan line 313 when viewed from the direction perpendicular to the substrate 301, and the extending portion 334 is larger than the width of the scan line 313 and completely covers a segment of the scan line 313. For example, an edge of the extending portion 334 is spaced from the scan, line 313 by a distance 901 greater than 1.2 micro meters. The purpose of this configuration is to prevent the insulation layer 320 from being etched to form another opening exposing the scan line 313, causing that the connection electrode 371 electrically connects the transparent electrode 350 to the scan line 313 through this opening. In addition, the opening 352 is at least partially overlapped with the extending portion 334, the opening 363/etching area ET1 is partially overlapped with the opening 352, and an area where the opening 352 is overlapped with the opening 363 is also overlapped with the opening 341 which would expose a portion of the extending portion 334.

Referring to the right half of FIG. 9A, when viewed from the direction perpendicular to the substrate 301, the contact structure 900 has several different materials. The first one is the insulation layer 360 in opening 352 but not in the opening 363; the second one is the touch sensing line 333/extending portion 334 in the opening 352 and the opening 363 that is also referred to as the first connection part 710; the third one is the transparent electrode 350 in the opening 363 but not in the opening 352 that is also referred to as the second connection part 720. For clarity, we omit the insulation layer 340 as well as the insulation layer 360 which have inclined surface in the opening 352 and the opening 363. FIG. 9B shows a phenomenon of "under cutting" between the first connection part 710 and the second connection part 720, that is, the insulation layer 340 (i.e. the second insulation layer) beneath the second connection part 720 is laterally etched, resulting in that a portion of the second connection part 720 is not supported by the insulation layer 340 and a portion of the second connection part 720 is partially overlapped with the first opening 341. The area where the phenomenon of under cutting occurs is illustrated as a dash line in FIG. 9A. In another embodiment, the phenomenon of under cutting may not occur or the extent thereof is minor, which is not limited in the invention. It is shown in FIG. 9A that, when viewed from the direction perpendicular to the substrate 301, the contour of the opening 363 and the contour of the opening 352 intersect at least two locations CX3, CX4. A portion of the contour of the opening 363 is illustrated as bold dash line in the area of the opening 352.

Figure 10A:
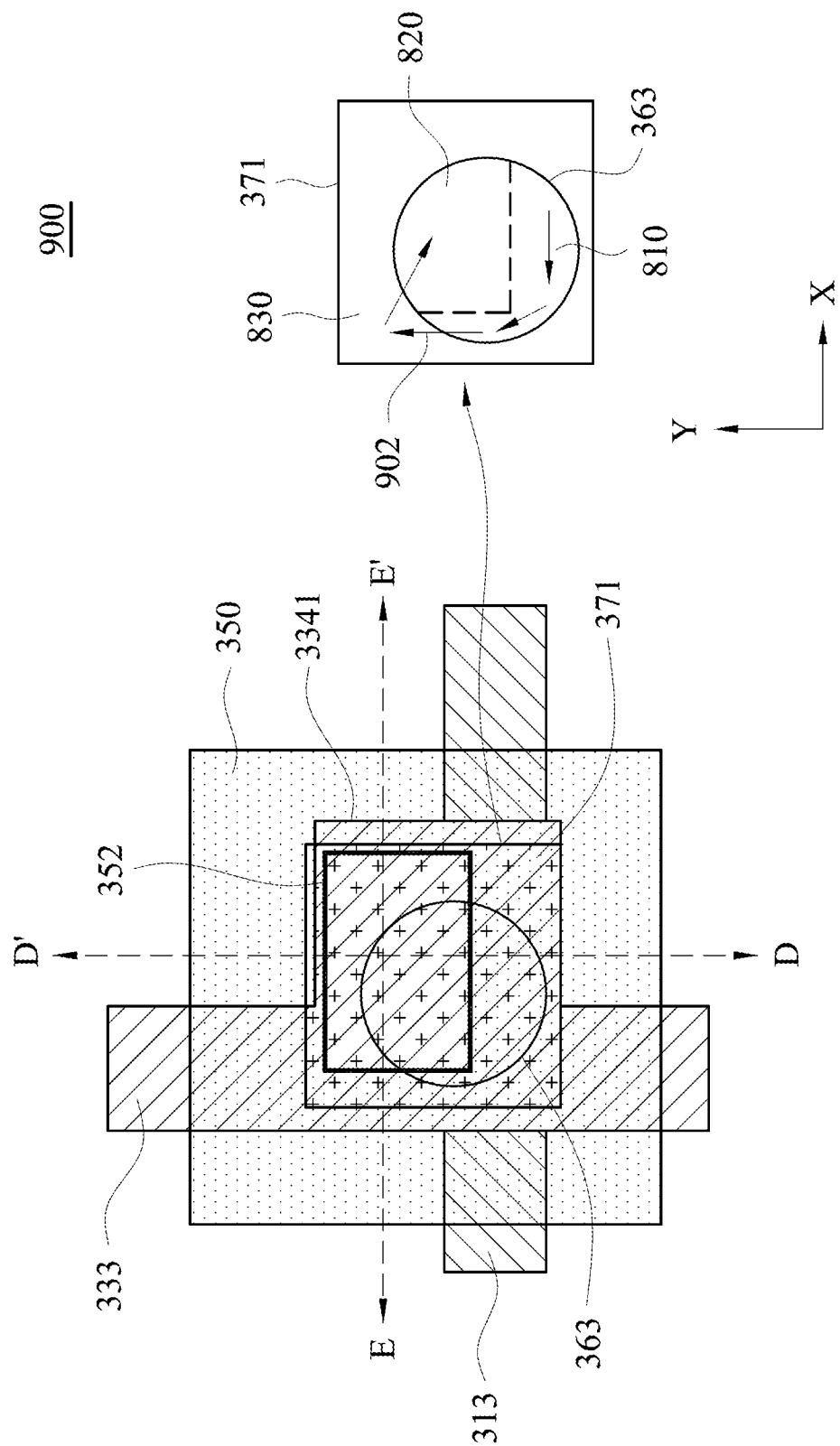
FIG. 10A is enlarged schematic diagram of the contact structure including a connection electrode.
Figure 10B:
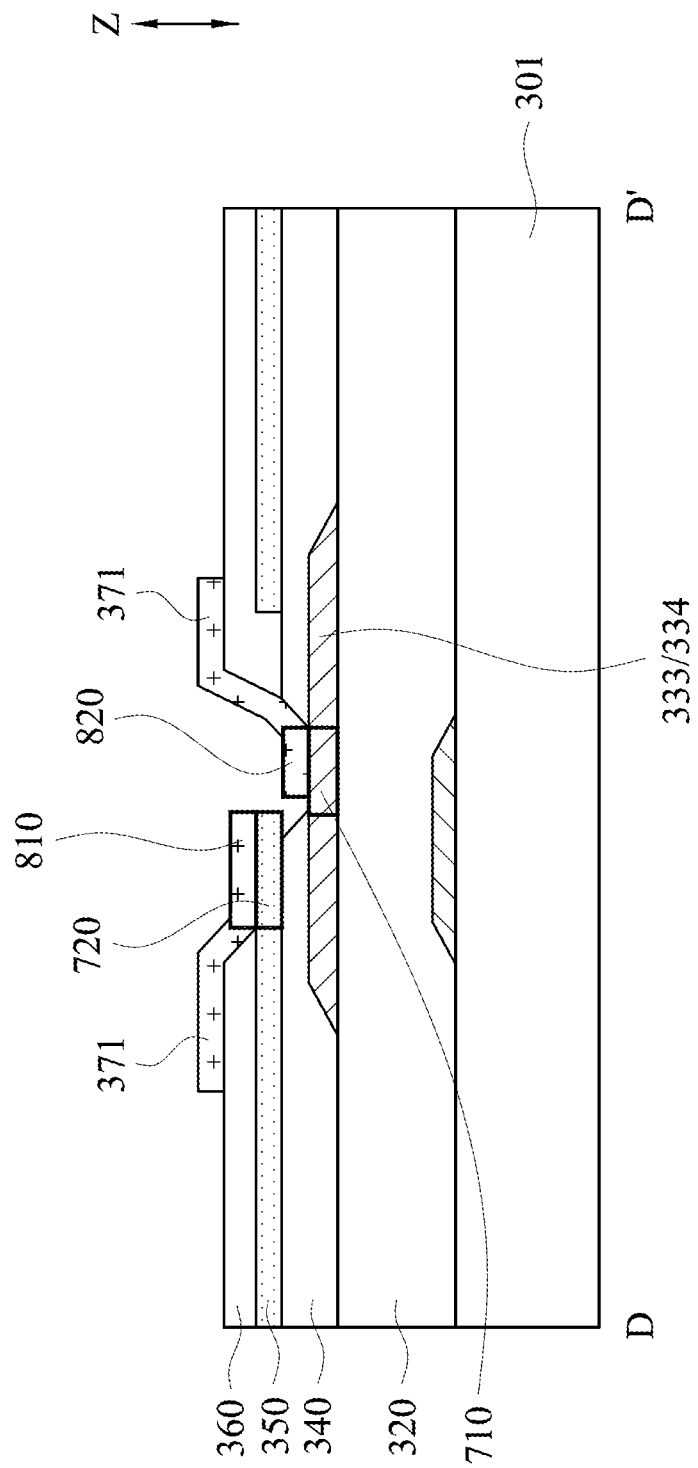
FIG. 10B is a cross-sectional view along a cross-sectional line DD' of FIG. 10A.
Figure 10C:
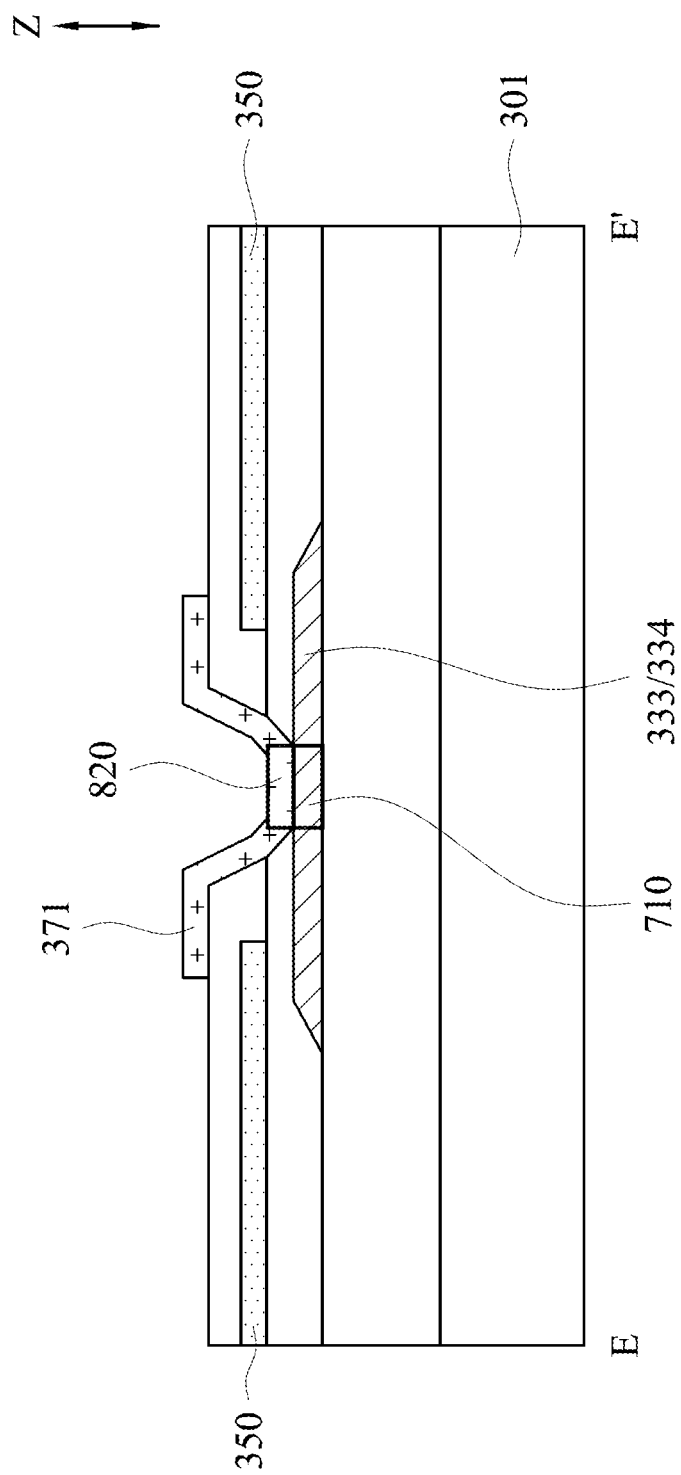
FIG. 10C is a cross-sectional view along a cross-sectional line EE' of FIG. 10A.

FIG. 10A is an enlarged schematic diagram of the contact structure including a connection electrode, FIG. 10B is a cross-sectional view along a cross-sectional line DD' of FIG. 10A, and FIG. 10C is a cross-sectional view along a cross-sectional line EE' of FIG. 10A. After the process of FIG. 9A and FIG. 9B, referring to FIG. 10A to FIG. 10C, a connection electrode 371 is formed on the insulation layer 360 for electrically connecting the transparent electrode 350 to the extending portion 334/touch sensing line 333. That is, the contact structure 900 includes a portion or all of the following units: the connection electrode 371, the third insulation layer 360, the third opening 363, the second connection part 720 of the first transparent electrode 350, the second opening 352 of the first transparent electrode 350, the second insulation layer 340, the first opening 341, the touch sensing line 333/extending portion 334 (i.e. the first connection part 710 of the second metal layer). In detail, when viewed from the direction perpendicular to the substrate 301, the connection electrode 371 is divided into three portions: the first portion 810 is in the opening 363 but not in the opening 352, in which the first portion 810 is in direct contact with the second connection part 720 (i.e. the portion of the first transparent electrode 350 exposed by the third opening 363) of FIG. 9A; the second portion 820 is in the opening 363 and the opening 352 for being in direct contact with the first connection part 710 (i.e. the portion of the touch sensing line 333 or the extending portion 334 exposed by the first opening 341) of FIG. 9A; the third portion 830 is the portion outside of the opening 363 that is in direct contact with the insulation layer 360 for connecting the first portion 810 to the second portion 820. Note that the dash line between the first portion 810 and the second portion 820 could represent the phenomenon of under cutting, and thus the first portion 810 may not be connected to the second portion 820. However, the first portion 810 is electrically connected to the second portion 820 through the third portion 830 (e.g. along a path 902 and arrow symbols direction or vice versa), and therefore the first connection part 710 is still electrically connected to the second connection part 720 even if the phenomenon of under cutting happens. That is, the function of the third portion 830 is to ensure the electrical connection between the touch sensing line 333 and the first transparent electrode 350 (i.e. touch electrode/common electrode) when the phenomenon of under cutting occurs. This configuration avoids an open circuit between the touch sensing line 333 and the first transparent electrode 350 or excessive resistance between the touch sensing line 333 and the first transparent electrode 350 when there is no open circuit but the thickness of the connection electrode 371 is relative small in partial region, such as region with inclined surface between the touch sensing line 333 and the first transparent electrode 350. Accordingly, the yield rate of the product is significantly increased.

Figure 10D:
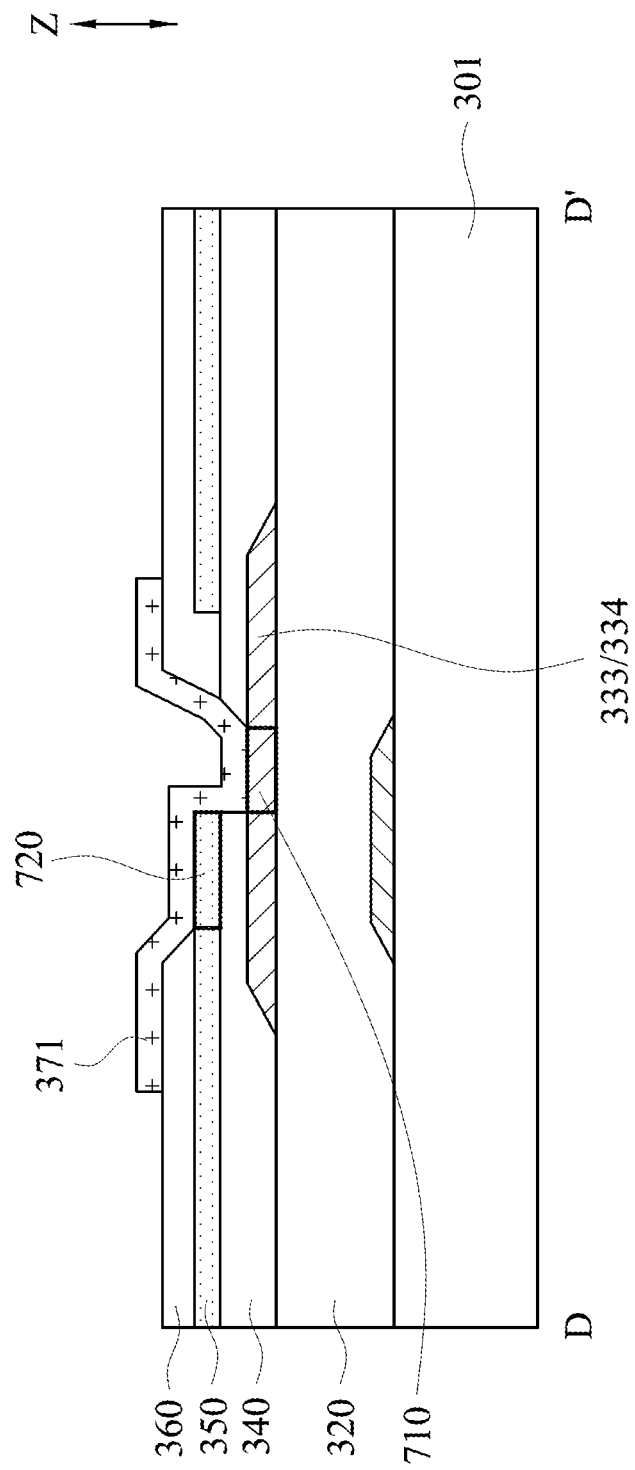
FIG. 10D is a cross-sectional view along a cross-sectional line DD' of FIG. 10A when under cutting does not occur.

FIG. 10D is a cross-sectional view along a cross-sectional line DD' of FIG. 10A when under cutting does not occur. Referring to FIG. 10D, in some embodiments that the phenomenon of under cutting does not occur, the connection electrode 371 is continuous, and therefore the second connection part 720 is electrically connected to the first connection part 710 through the connection electrode 371. In other words, the phenomenon of under cutting may exist slightly or even may not occur when the thickness of the insulation layer 340 is appropriate such as 1000-6000 Angstrom (A). In this case, the connection electrode 371 extends towards the touch sensing line 333/extending portion 334 through a side surface of the first transparent electrode 350 (i.e. touch electrode/common electrode) and a side surface of the insulation layer 340. However, the idea of the invention is to ensure that, no matter the phenomenon of under cutting occurs or not, the first transparent electrode 350 (i.e. touch electrode/common electrode) is electrically connected to the touch sensing line 333/extending portion 334 effectively, that is, the risk of defect rate is considered.

Figure 11A:
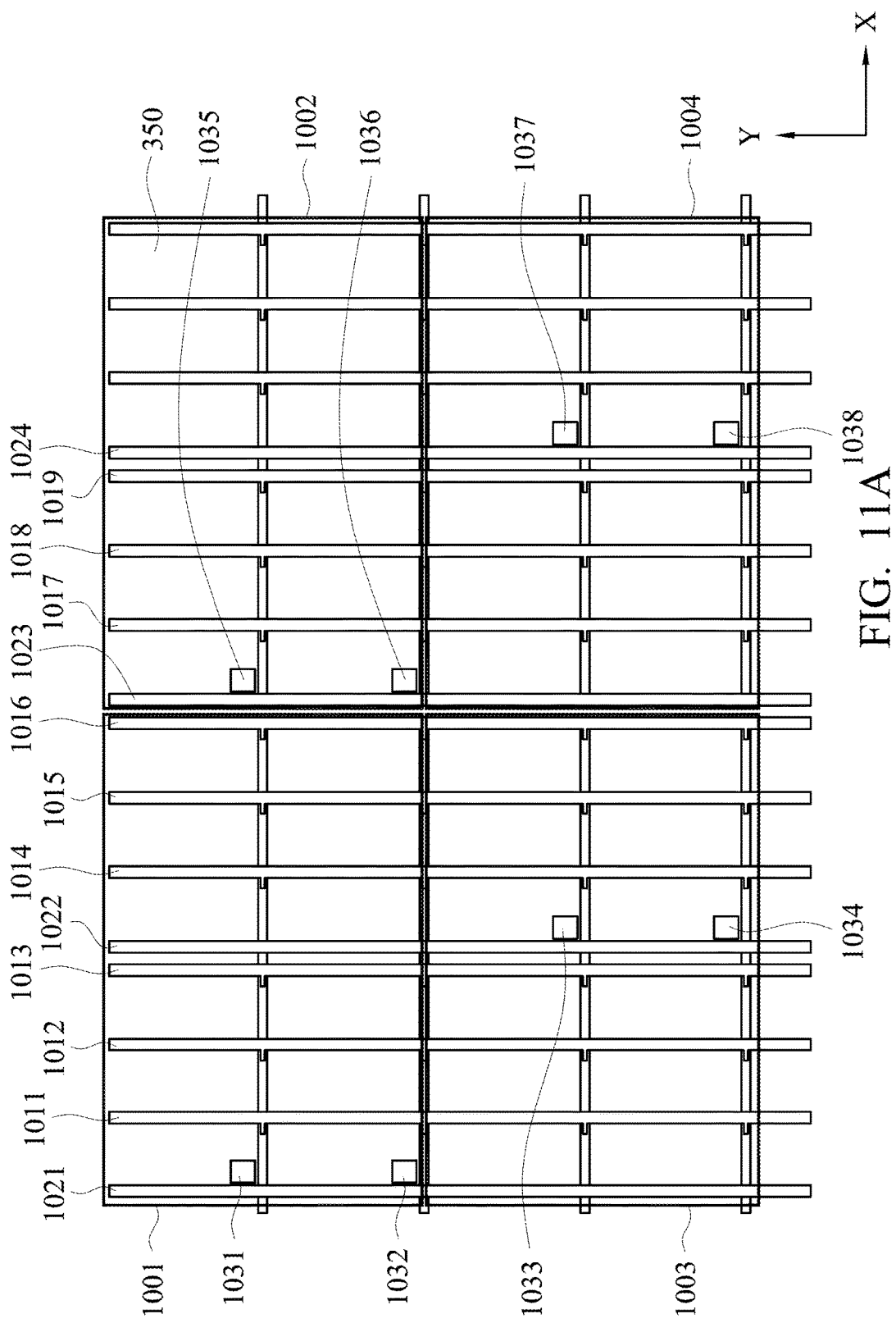
FIG. 11A is a schematic top view of multiple touch electrodes and pixel structures in accordance with an embodiment.

FIG. 11A is a schematic top view of multiple touch electrodes and pixel structures in accordance with an embodiment. Referring to FIG. 11A, in the embodiment of FIG. 11A, four touch electrodes 1001-1004 are shown. Each touch electrode includes the first transparent electrode 350 for 12 pixel structures and two contact structures. For simplification, only data lines 1011-1019, touch sensing lines 1021-1024, touch electrodes 1001-1004 and contact structures 1031-1038 are illustrated in FIG. 11A, and thin film transistors, pixel electrodes, openings of the touch electrodes, etc. are omitted. Along the X direction, one touch sensing line is disposed with every three data lines. For example, three data lines 1011-1013 are disposed between the touch sensing lines 1021, and 1022. In other words, one touch sensing line is disposed in every three pixel structures. However, the invention is not limited thereto. In other embodiments, one touch sensing line may be disposed in every N pixel structures in a row along the X direction where N is 1 to 51. For example, if a touch electrode overlaps 45 pixel structures in a row along the X direction, there could be 1 touch sensing line as well as 44 auxiliary lines (not shown in the figures) or could be 45 touch sensing lines and so on. The auxiliary lines are formed by a same manufacturing process as the touch sensing line for the purpose of decreasing resistance of the touch electrode. In addition, the number of the contact structures which correspond to one touch electrode is at least one, which is not limited in the invention. The touch sensing line 1021 is electrically connected to the touch electrode 1001 through the contact structures 1031-1032 (shown by schematic block diagram). The touch sensing line 1022 is electrically connected to the touch electrode 1003 through the contact structures 1033-1034. The touch sensing line 1023 is electrically connected to the touch electrode 1002 through the contact structures 1035-1036. The touch sensing line 1024 is electrically connected to the touch electrode 1004 through the contact structures 1037-1038. Data lines 1017-1019 are disposed between the touch sensing line 1023 and the touch sensing line 1024. The touch electrodes 1001-1004 are spaced from each other and are electrically connected to the corresponding touch sensing lines 1021-1024 respectively. Therefore, the touch electrodes 1001-1004 are electrically insulated from each other, and each of them receives a Vcom signal in the display period and a touch sensing signal in the touch period from the corresponding touch sensing line 1021-1024. The touch driving and sensing approaches performed in the touch period may adopt self-capacitance touch sensing technology or mutual-capacitance touch sensing technology which is well-known and will not be described.

In some embodiments, different contact structures may be disposed at different locations. For example, the contact structure 1035 is formed in accordance with the structure of FIG. 8C, and the contact structure 1036 is formed in accordance with the structure of FIG. 10A. In some embodiments, the contact structure 1036 is close to an edge of the touch electrode 1002, and therefore the opening 352 of the transparent electrode 350 is formed by an edge of the touch electrode 1002 extending inward due to the limitation of lithography.

Figure 11B:
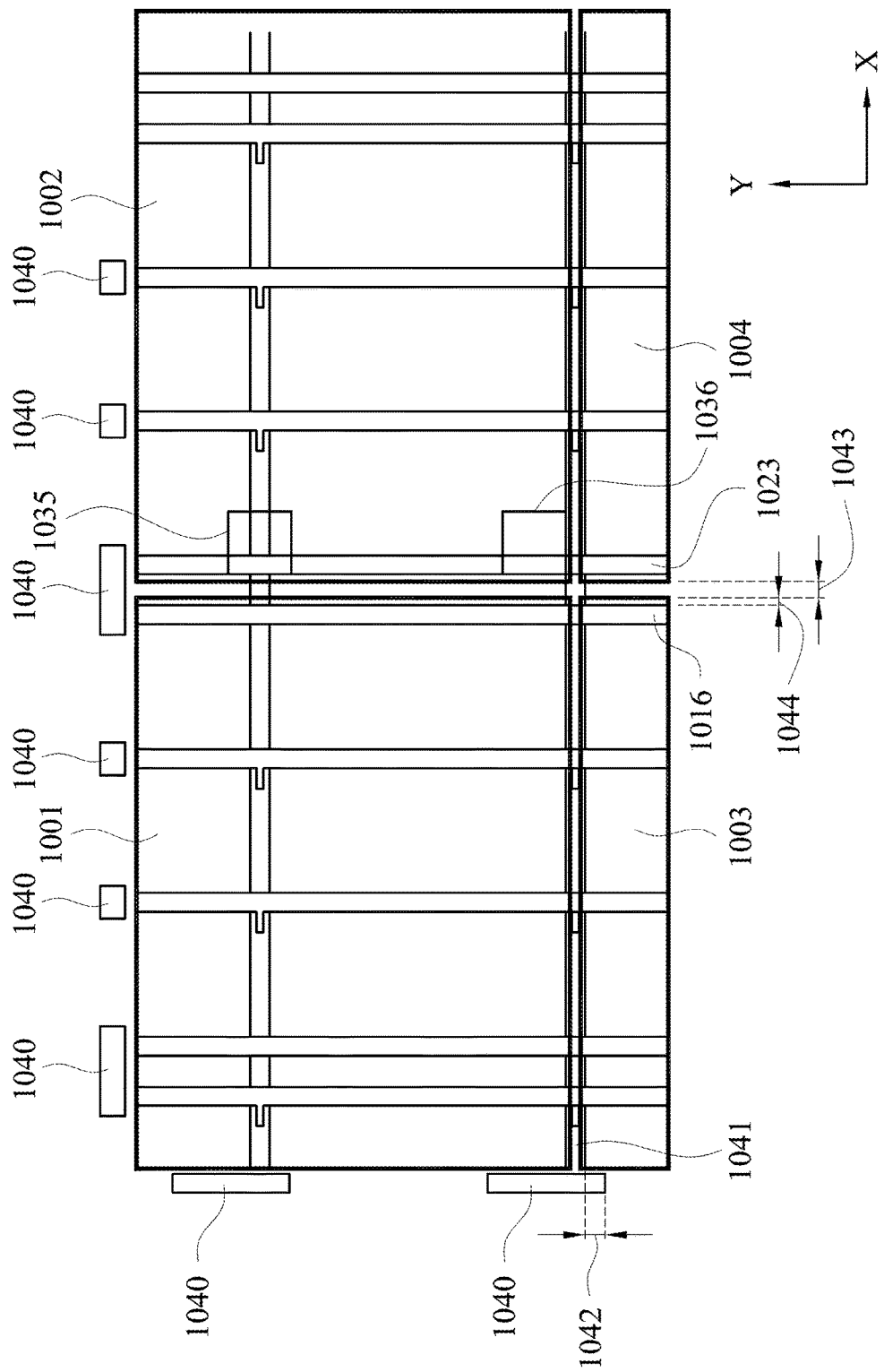
FIG. 11B is schematic diagram illustrating the configuration of a black matrix layer and the touch electrodes in the display device in accordance with an embodiment.
Figures 14A, 14B:
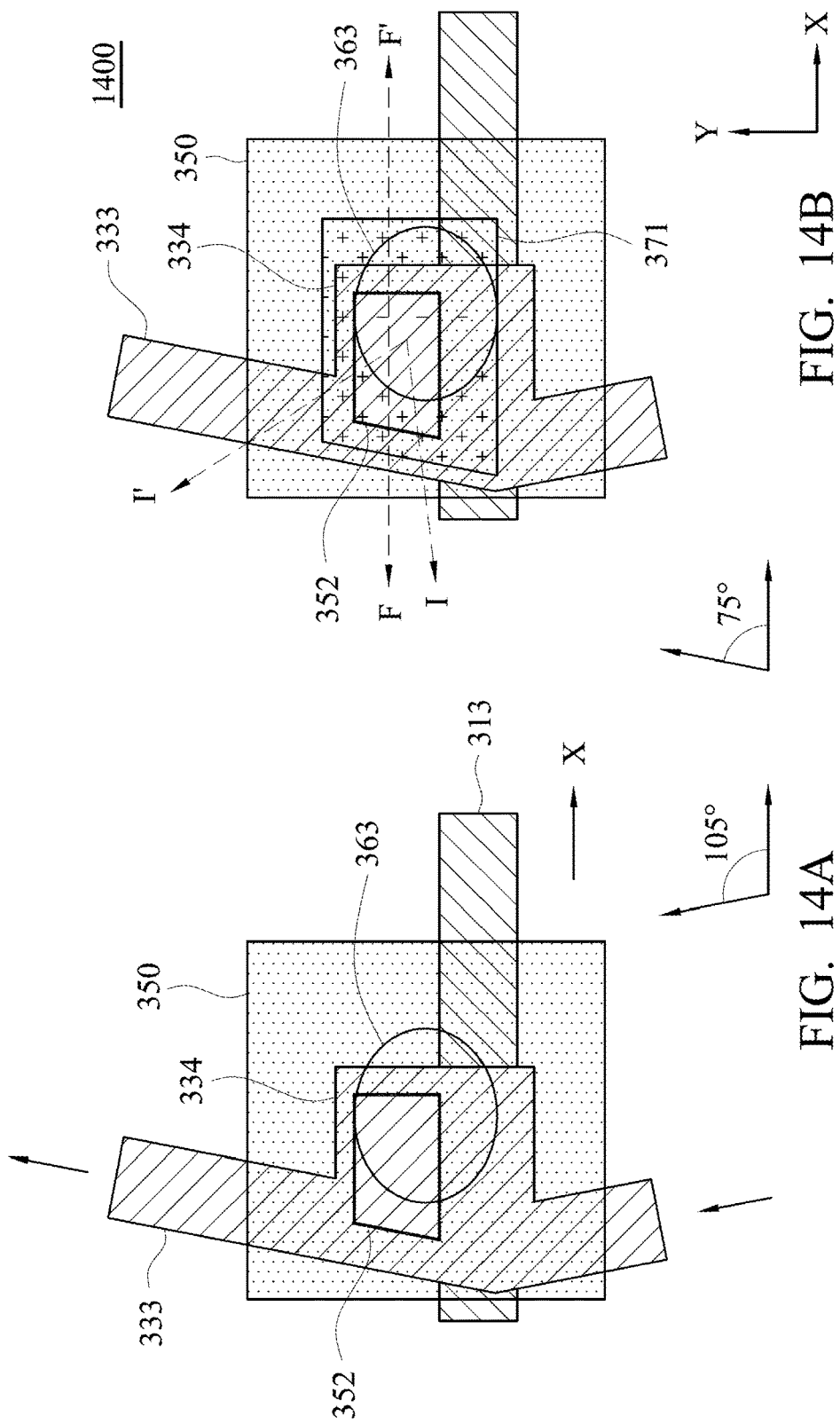
FIG. 14A and FIG. 14B are top views of intermedia step for manufacturing the contact structure in accordance with an embodiment.

FIG. 11B is a schematic diagram illustrating the configuration of a black matrix layer and the touch electrodes in the display device in accordance with an embodiment. In general, a black matrix layer is disposed on the opposite substrate (e.g. the black matrix layer BM802 is disposed on the opposite substrate 801 in FIG. 8A). Referring to FIG. 11B, a black matrix layer 1040 has a matrix form for covering the data lines, the touch sensing lines, the scan lines, the thin film transistor, etc. For clarity, only a part of black matrix layer 1040 is illustrated in FIG. 11B showing the width of the black matrix layer, it should be understood that the black matrix layer would extend along X direction and along Y direction. For example, the black matrix layer 1040 would vertically extend to cover the data line 1016, and horizontally extend to cover the scan line 1041. In this embodiment, the black matrix layer 1040 exceeds the bottom edge of the scan line 1041 by a distance 1042 from the top view perpendicular to the substrate 301. In some embodiments, the distance 1042 is in a range from 3 micro meters to 7 micro meters. In addition, there is a gap between the touch electrode 1003 and the touch electrode 1004, the width 1043 of this gap is greater than or equal to 3 micro meters, and the gap is parallel with the touch sensing line and locates between the touch sensing line 1023 and the data line 1016 adjacent to the touch sensing line 1023. That is, the edge of each of the touch electrodes 1001-1004 may include a straight line shape as shown in FIG. 11B or a zigzag shape (not shown) corresponding to the data line as shown in FIG. 14B. An edge of the touch electrode 1003 exceeds the edge of the data line 1016 by a distance 1044 for the purpose of shielding the noise from the data line 1016 to the pixel electrodes 372 (as shown in FIG. 8A) located above the touch electrodes 1003. In some embodiments, the distance 1044 is greater than or equal to 1 micro meter. There is another gap between the touch electrode 1001 and the touch electrode 1003, and the width of this gap is greater than or equal to 3 micro meters. In addition, a patterned third metal layer (not shown) may be disposed between the touch electrodes 1001-1004 and the insulation layer 340 or between the touch electrodes 1001-1004 and the insulation layer 360 along the pattern of the black matrix layer 1040. To be specific, the patterned third metal layer includes multiple auxiliary electrodes such as four auxiliary electrodes that are formed electrically connecting to the touch electrodes 1001-1004. These auxiliary electrodes are electrically insulated from each other for the sake of reducing resistances of the touch electrodes 1001-1004.

In addition to the embodiments of FIG. 8C and FIG. 10A, the contact structure may have other designs. For example, referring to FIG. 12A and FIG. 12B, the connection electrode has not been formed in the FIG. 12A. When viewed from the direction perpendicular to the substrate 301, the contact structure 1200 at least includes three different materials. The first one is the insulation layer 360 (i.e. the third insulation layer) in the opening 352 but not in the opening 363; the second one is the touch sensing line 333/extending portion 334 in the opening 352 and the opening 363 that is also referred to as the first connection part 710; the third one is the transparent electrode 350 (i.e. the first transparent electrode) in the opening 363 but not in the opening 352 that is also referred to as the second connection part 720. The other parts are similar or identical to the contact structure 900, and they will not be described again for simplification.

Figure 12A:
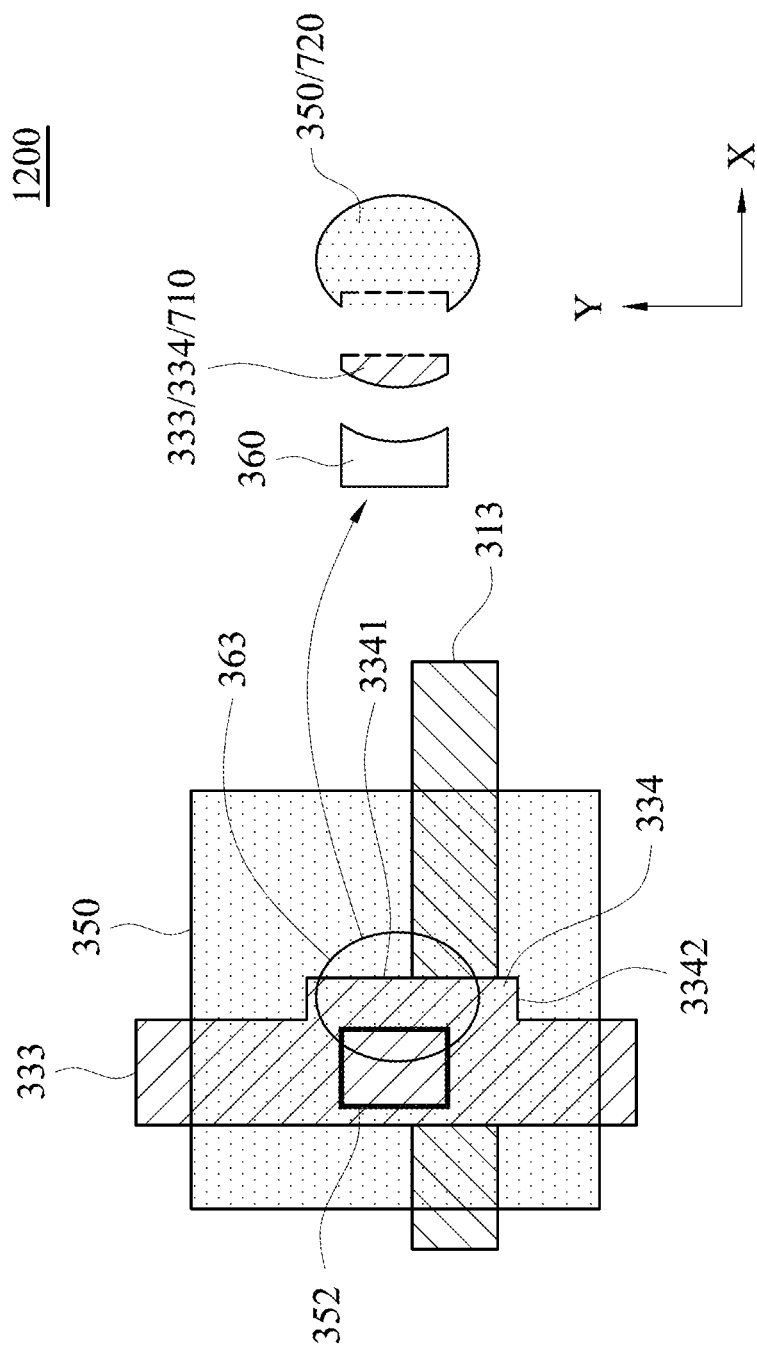
FIG. 12A and FIG. 12B are top views of intermedia step for manufacturing the contact structure in accordance with an embodiment.
Figure 12B:
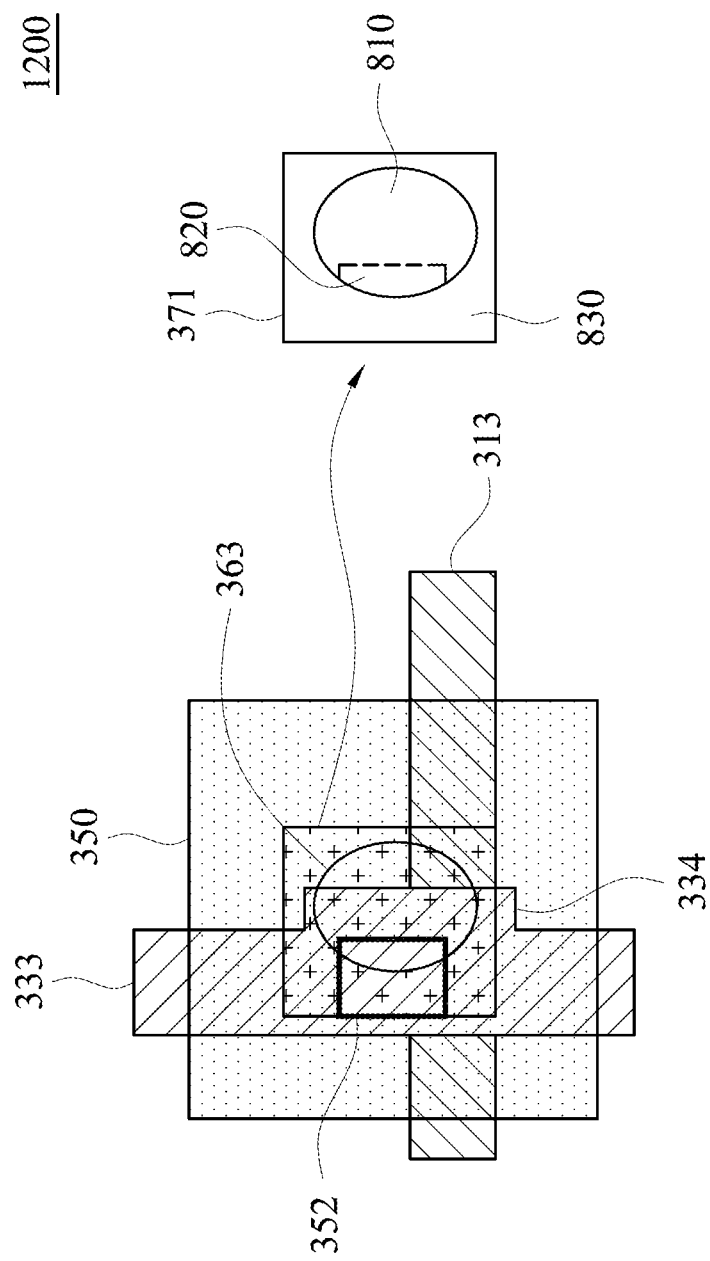

Note that if the phenomenon of under cutting occurs between the first connection part 710 and the second connection part 720, the place where under cutting occurs is illustrated as a dash line in FIG. 12A. In addition, the contact structure 1200 includes the connection electrode 371 in the embodiment of FIG. 12B. When viewed from the direction perpendicular to the substrate 301, the connection electrode 371 is divided into three portions: the first portion 810 is in the opening 363 but not in the opening 352, in which the first portion 810 directly contacts the second connection part 720; the second portion 820 is in the opening 363 and the opening 352 for directly contacting the first connection part 710; the third portion 830 is the portion outside of the opening 363 and directly contacts the insulation layer 360 for connecting the first portion 810 to the second portion 820. When viewed from the direction perpendicular to the substrate 301, the comparison between FIG. 12A and FIG. 10A is as follows: in FIG. 10A, the largest length of the opening 352 along the X direction is greater than that along the Y direction, and the opening 363 partially overlaps the opening 352; in FIG. 12A, the largest length of the opening 352 along the Y direction is greater than that along the X direction, and the opening 363 is at the right side of the opening 352. The opening 363 is larger than the opening 352, and the opening 363 is partially overlapped with the touch sensing line 333/extending portion 334. The connection electrode 371 covers the opening 352 and the opening 363. The extending portion 334 is a part of the touch sensing line 333 and extends toward right side, and partially overlaps with the opening 363. Most of the right edge 3341 of the extending portion 334 is located in the opening 363 form the top view perpendicular to the substrate 301. The largest length of the extending portion 334 in Y direction is larger than that of the opening 363. The bottom edge 3342 of the extending portion 334 exceeds the scan line 313 along −Y direction to protect the scan line from being damaged by etching process when the opening 363 is formed.

FIG. 13A and FIG. 13B respectively show an enlarged partial region of the display from a top view perpendicular to the substrate 301. FIG. 13A shows the contact structure before the connection electrode 371 is formed and FIG. 13B shows the contact structure after the connection electrode 371 is formed in accordance with an embodiment. The contact structure 1300 in FIG. 13A does not include the connection electrode 371 yet, but the connection electrode 371 is included in FIG. 13B. In this embodiment, the length of the opening 352 along the Y direction is greater than that along the X direction, and the opening 363 is at the left side of the opening 352. The extending portion 334 extends toward right side and partially overlaps with the opening 352. Most of the right edge 3341 of the extending portion 334 is located in the opening 352 form the top view perpendicular to the substrate 301. The largest length of the extending portion 334 in Y direction is larger than that of the opening 352. The bottom edge 3342 of the extending portion 334 exceeds the scan line 313 along −Y direction to protect the scan line from damage by etching process when the opening 363 is formed. People skilled in the art should be able to understand the architectures shown in FIG. 13A and FIG. 13B are based on the embodiments described above, and therefore the same labels/symbols in the contact structure 1300 as those in embodiments described above will not be described repeatedly.

FIG. 14A and FIG. 14B respectively show an enlarged partial region of the display from a top view perpendicular to the substrate 301. FIG. 14A shows the contact structure 1400 before the connection electrode 371 is formed and FIG.

14B shows the contact structure 1400 after the connection electrode 371 is formed in accordance with an embodiment. In this embodiment, the touch sensing line 333 has a jagged shape along the Y direction, and the extending portion 334 is disposed at a corner of the touch sensing line 333. On one hand, the scan line extends along the first direction (i.e. X direction). On the other hand, the jagged touch sensing line 333 extends substantially along the second direction (i.e. Y direction) by a zigzag path. Therefore, an angle between the first direction and the touch sensing line 333 may be in a range from 75 degrees to 105 degrees. People skilled in the art should be able to understand that the architectures shown in FIG. 14A and FIG. 14B are based on the embodiments described above, and therefore the same labels/symbols in the contact structure 1300 as those in embodiments described above will not be described repeatedly. Furthermore, the shapes of the extending portion 334, the second opening 352 and the third opening 363 in all embodiments (FIG. 1 to FIG. 15B) of the invention may be, but not limited to, circle, rectangle, oval, polygon or any other shapes.

Figure 15A:
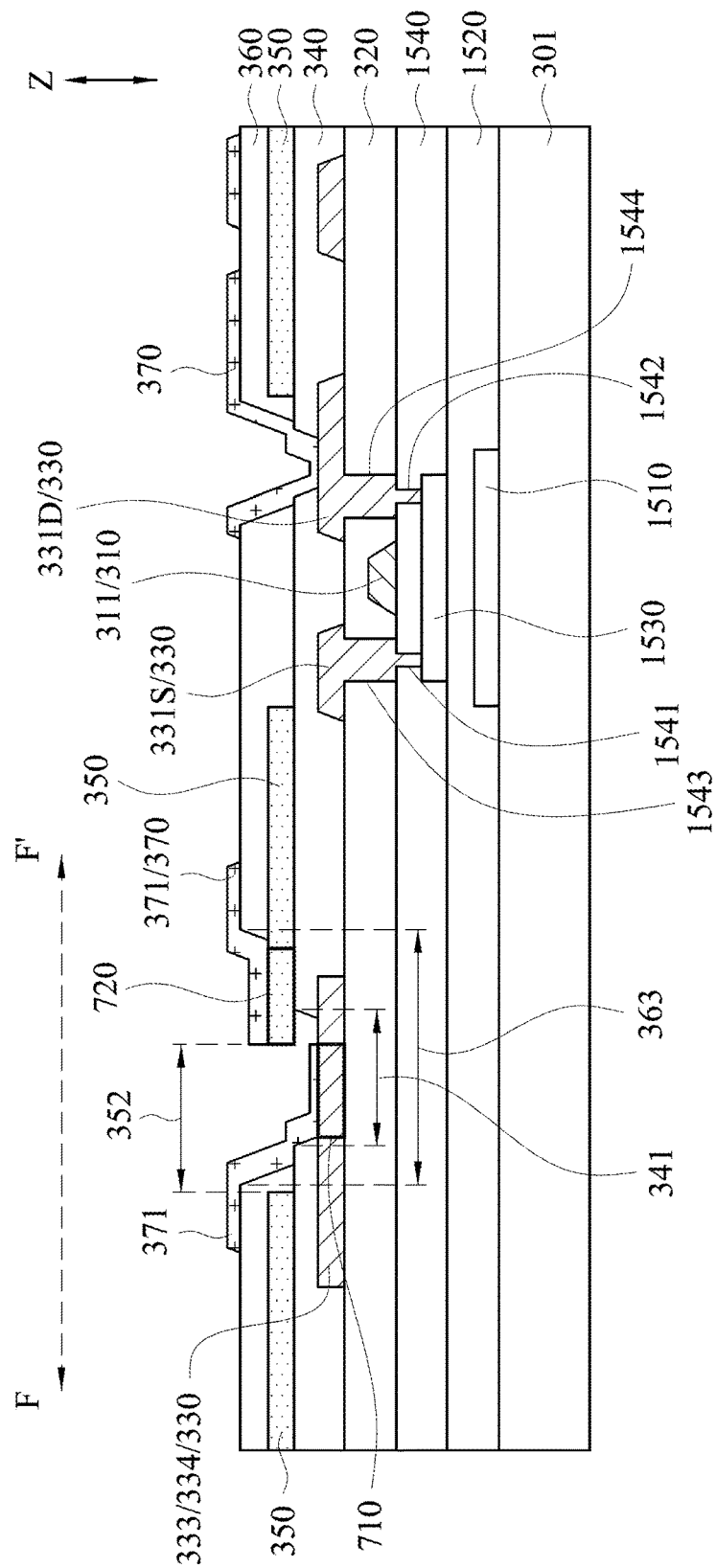
FIG. 15A is a cross-sectional view along a cross-sectional line FF' of FIG. 14B.
Figure 15B:
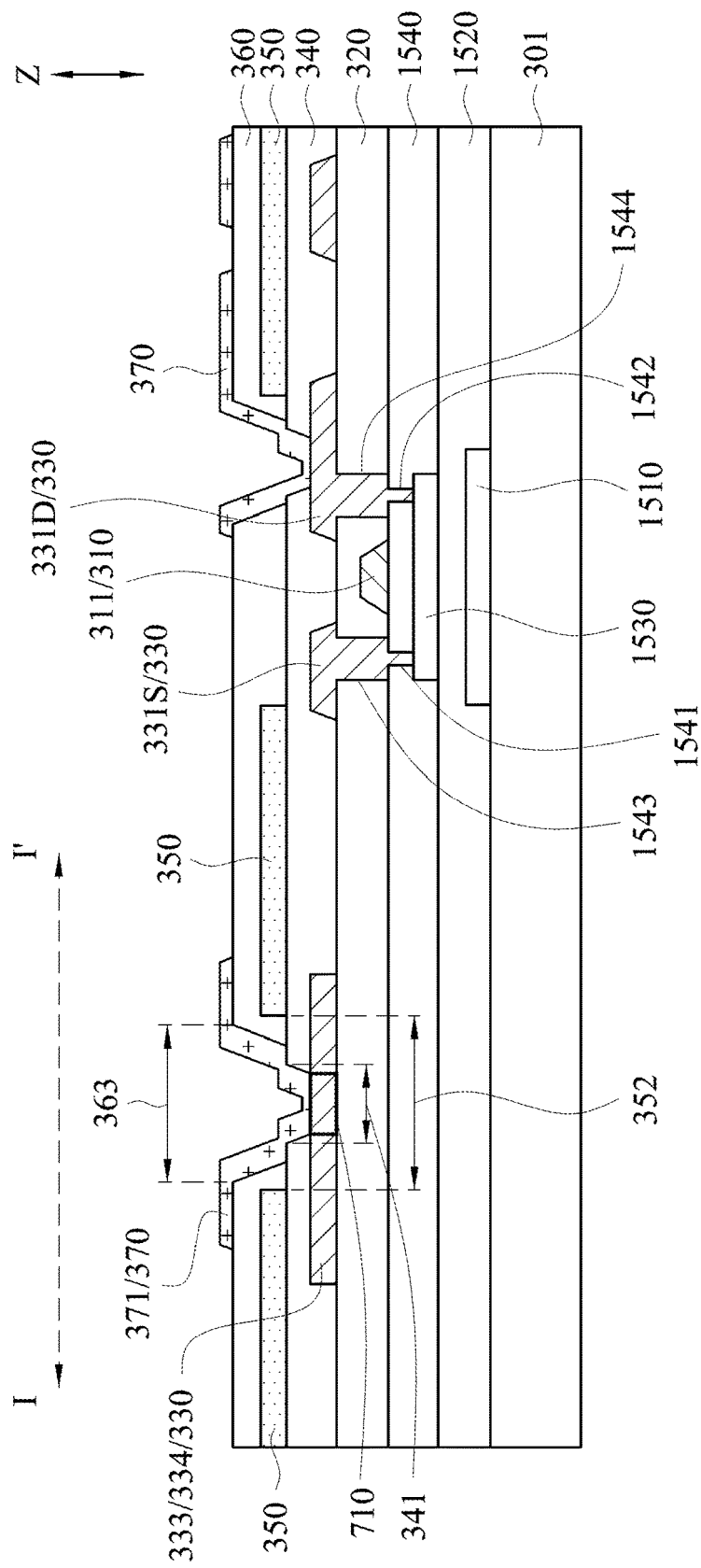
FIG. 15B is a cross-sectional view along a cross-sectional line II' of FIG. 14B.

FIG. 15A is a cross-sectional view along a cross-sectional line FF' of FIG. 14B. FIG. 15B is a cross-sectional view along a cross-sectional line II' of FIG. 14B. Not only the contact structure is illustrated in FIG. 15A and FIG. 15B, a thin film transistor (TFT) is also illustrated. In particular, the channel of the TFT includes material of poly-silicon. For example, the TFT is formed by a low temperature polysilicon process. In detail, a patterned light shielding layer 1510 is formed on the substrate 301 and is under the semiconductor layer 1530. An insulation layer 1520 (also referred to a fourth insulation layer) is formed on the light shielding layer 1510 and between the substrate 301 and the first insulation layer 320. The insulation layer 1520 or insulation layer 1540 can be a two layers structure stacked with each other (not shown in FIG). One of which includes material $SiN_2$ and the other one includes material $SiO_2$. A patterned semiconductor layer 1530 is formed on the insulation layer 1520 and under the gate 311 to serve as a channel of the TFT. The patterned semiconductor layer 1530 is disposed above and corresponding to the light shielding layer 1510 which is used to prevent the operation of the semiconductor layer 1530 from being affected (e.g. the TFT may have leakage current) by ambient light irradiated from the below. Moreover, the size of the patterned light shielding layer 1510 may be larger than that of the channel, a patterned semiconductor layer 1530, from the viewing angle perpendicular to the substrate 301 to shield the ambient light and prevent the channel from a side effect of current leakage. Also, the size of the patterned light shielding layer 1510 can be slightly small than that of channel, for example, 85% size of the channel. The patterned light shielding layer 1510 can be formed by metal material such as Mo or Al with thickness 300 A°-1200 A°. During the process of forming the semiconductor layer 1530, there are many processes to form the polysilicon channel, lightly doped region, medium doped region, etc. which are well-known and therefore they will not be described. An insulation layer 1540 (also referred to as a fifth insulation layer) is formed on the semiconductor layer 1530 and under the first conductive layer, such as a metal layer 310 but not limited thereto, and the insulation layer 1540 has openings 1541 and 1542 to expose portions of the semiconductor layer 1530. The metal layer 310 is formed on the insulation layer 1540, and includes the gate 311 and a scan line (not shown). The insulation layer 320 (i.e. the first insulation layer) is formed on the metal layer 310. The insulation layer 320 has an opening 1543 corresponding to the opening 1541, and an opening 1544 corresponding to the opening 1542. The gate 311 locates between the openings 1543 and 1544. The insulation layer 320 can be one layer or multiple layers. For example, the insulation layer 320 is one layer including inorganic materials such as $SiN_2$ or $SiO_2$. Or, the insulation layer 320 can be a two layers structure stacked with each other (not shown in FIG). One of which includes organic materials and the other one includes inorganic materials such as $SiN_2$ or $SiO_2$. The metal layer 330 is formed on the insulation layer 320, and includes the touch sensing line 333/extending portion 334, the source 331S and the drain 331D. The touch sensing line 333 may also include an extending portion 334. In other words, the extending portion 334 can be regarded as a portion of the touch sensing line 333. The source 331S is electrically connected to the semiconductor layer 1530 through the openings 1543 and 1541, and the drain 331D is electrically connected to the semiconductor layer 1530 through the openings 1544 and 1542. The manufacturing process and architecture after and above the metal layer 330 is similar to the embodiments described above (e.g. embodiment of FIG. 8A to FIG. 14B), and therefore it will not be described again. That is, the design and the process of the patterned first transparent electrode 350, the insulation layer 360 (i.e. the third insulation layer), the patterned second transparent electrode 370, the insulation layer 340 (i.e. the second insulation layer), the connection electrode 371, the first opening 341, the second opening 352, the third opening 363, etc. above the metal layer 330 are similar to the aforementioned embodiments (e.g. embodiment of FIG. 8A to FIG. 14B), and therefore identical labels and terminologies are used.

A difference between embodiment as in FIG. 15A to FIG. 15B and aforementioned embodiments as in FIG. 8A to FIG. 14B is that in FIG. 8A to FIG. 14B, the patterned semiconductor layer 321 is formed on the insulation layer 320, but in FIG. 15A, the patterned semiconductor layer 1530 is formed under the insulation layer 320 (i.e. the first insulation layer). Therefore, the concept of the invention can be achieved with the TFT unit having a bottom gate or the TFT unit having a top gate. In addition, the material of the channel of the TFT unit may include amorphous silicon, micro grain silicon, oxide semiconductor, polysilicon, continuous grain silicon, etc., which is not limited in the invention. On the other hand, in the embodiments of FIG. 8A and FIG. 15A, the pixel electrode is above the common electrode. However, the pixel electrode may be under the common electrode in other embodiments, which is not limited in the invention. As described in the aforementioned embodiments shown in FIG. 8A to FIG. 15B, when the thickness of the insulation layer 340 is appropriate, the phenomenon of under cutting may not occur, and in this case, the connection electrode 371 extends towards the touch sensing line 333/extending portion 334 along a side surface of the first transparent electrode 350 (i.e. touch electrode/common electrode) and a side surface of the insulation layer 340. Therefore, no matter the phenomenon of under cutting occurs or not, it is ensured that the first transparent electrode 350 (i.e. the touch electrode/common electrode) is electrically connected to the touch sensing line 333/extending portion 334 effectively by the connection electrode 371.

In another embodiment, an additional photolithography process (i.e. seventh photolithography process) could be employed to form a contact hole in the insulation layer 320 for allowing the patterned metal layer 330 electrically connecting to the patterned metal layer 310 through the contact hole (not shown) directly in non-display area 102. The benefit of this process is to achieve a slim border in non-display area 102 of a display panel. That is, a slim border array substrate with in cell touch function can be achieved by only employing seven photolithography processes.

Referring to FIG. 8A, FIG. 15A and FIG. 1, in some embodiments, the patterned first transparent electrode 350 is formed to comprise an approximate rectangular contour. In FIG. 1, there are four touch electrodes C11, C12, C21, and C22, and each touch electrode corresponds to 4 pixel structures. In practical design, for example, a 720 (data line)×3 (RGB)×1280 (scan line) resolution product may include 18×32=576 touch electrodes (transparent electrode 350). That is, there are 720×3=2160 data lines and 1280 scan lines with 2160×1280=2764800 pixel structures (sub-pixels). In other words, one touch electrode corresponds to 40×3×40=4800 pixel structures (sub-pixels), which means the Length (L) of each touch electrode as shown in FIG. 1 may include the length of 40 pixel structures (40 rows) and the width (W) of each touch electrode may include the width of 40×3=120 pixel structures (120 columns). One patterned first transparent electrode 350 in FIG. 8A or FIG. 15A can be regarded as one of the touch electrodes C11, C12, C21, and C22. Therefore, each touch electrode has an approximate square contour (1:1) because one pixel structure has a contour with an approximate ratio of 3:1 in length of itself (Y direction) to width (X direction) of itself.

Figure 16:
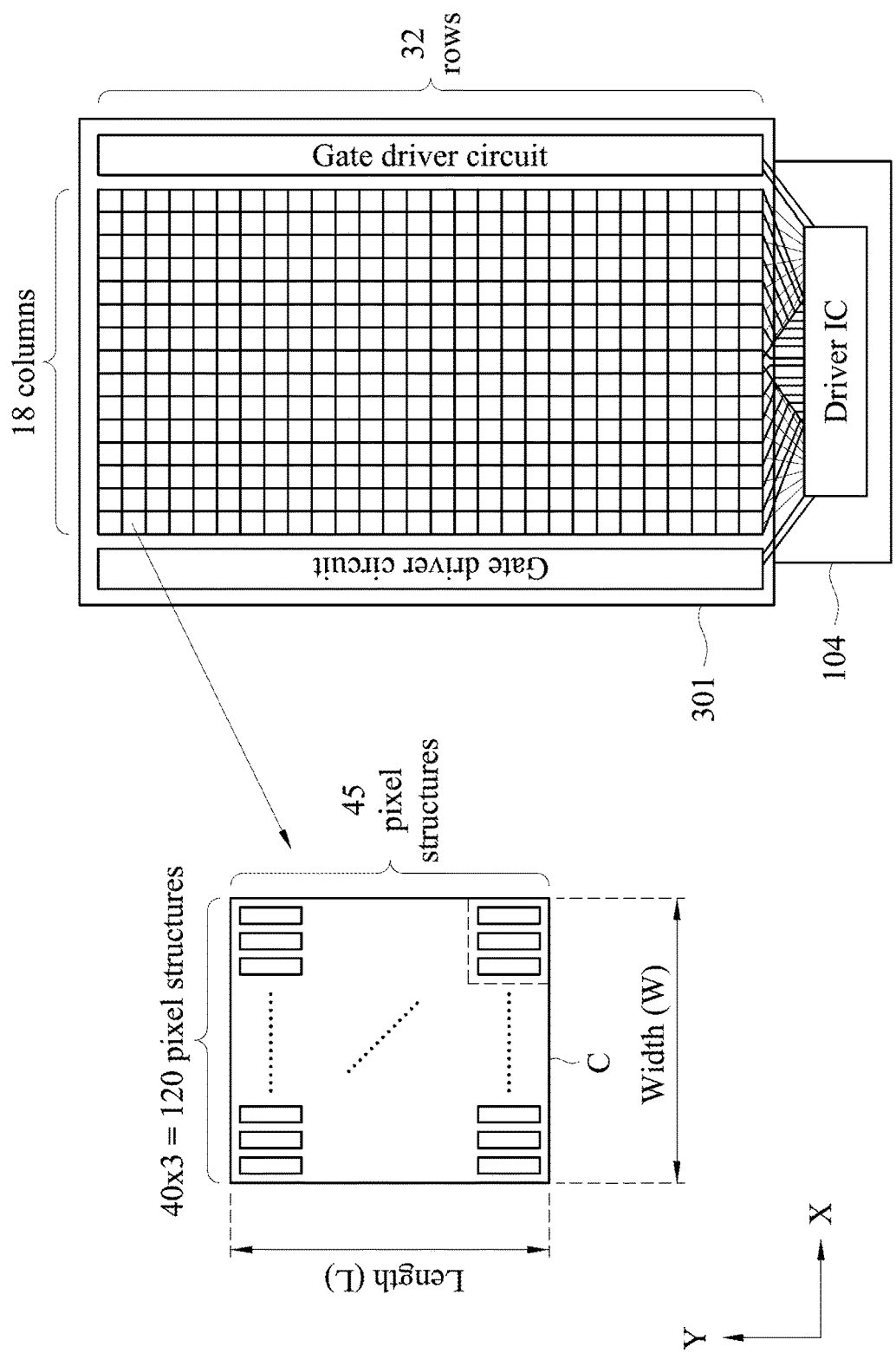
FIG. 16 is a schematic diagram showing the number of touch electrodes, wherein each of the touch electrodes has a proximate rectangular contour and corresponds multiple pixel structures in accordance with an embodiment.

For another embodiment, a 720×3×1440 resolution product may also include 18×32=576 touch electrodes (transparent electrode 350). That is, there are 720×3=2160 data lines and 1440 scan lines. however, one touch electrode C corresponds to 40×3×45=5400 pixel structures (sub-pixels), which means the Length (L) of each touch electrode may include the length of 45 pixel structures (45 rows) and the width (W) of each touch electrode may include the width of 40×3=120 pixel structures (120 columns) as shown in FIG. 16. One patterned first transparent electrode 350 in FIG. 8A or FIG. 15A can be regarded as one of the touch electrodes C11-C22 shown in FIG. 1 or a touch electrode C shown in FIG. 16, and each touch electrode has an approximate rectangular contour. Hence, the ratio of the approximate rectangular contour's length (L) to the approximate rectangular contour's width (W) is near 1.125:1 as shown in FIG. 16. Moreover, the edge shape of the approximate rectangular contour can be a straight line shape, a wave shape, or a zigzag shape . . . etc (not shown in FIG) to avoid moire' effect saw by human eyes.

Referring to FIG. 16, the flexible substrate 104, such as a flexible printed circuit board, with at least one in-cell touch driver IC thereon electrically connecting with the touch sensing lines, data lines and scan lines which are on the substrate 301. In another embodiment, the flexible substrate 104 and the substrate 301 can be integrated to be a same substrate such as a polyimide substrate.

For another embodiment, a 720×3×1480 resolution product may still include 18×32=576 touch electrodes (transparent electrode 350). Therefore, one touch electrode C would correspond to 40×3×46=5520 pixel structures (sub-pixels) in the $2^{nd}$ row to the $31^{th}$ row, and each touch electrode C in the $1^{st}$ row as well as the $32^{th}$ row would correspond to 40×3×50=6000 pixel structures (sub-pixels) respectively. Hence, the ratio of the approximate rectangular contour's length (L) to the approximate rectangular contour's width (W) would be near 1.25:1 (not shown).

From the embodiments mentioned above, although the number of touch electrodes, such as 576, is fixed, the number of scan line may change according to requirement of design. In other words, a patterned first transparent electrode 350 (touch electrode C) could be formed to comprise an approximate rectangular contour from a top view perpendicular to the substrate as shown in FIG. 16, and the ratio of the contour's length to contour's width can be in the range of 1:1-1.3:1, in which the approximate rectangular contour's length (L) is along Y direction that is substantially orthogonal to the scan lines extending in X direction. The benefit of this design can employ only one same type of driver IC with fixed number of channels connected to touch electrodes to acquire different size of in-cell touch display panel. It can be imaged that this' kind of design would get huge success in commercial business.

Although the present invention has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present invention without departing from the scope or spirit of the invention. For example, the contact structures in all of the embodiments mentioned above are all located in bottom left corner of a pixel structure, but people skilled in the art can relocate the contact structures to the upper left corner, the upper right corner, the bottom right corner, or bottom middle of the pixel structure, etc. In view of the foregoing, it is intended that the present invention cover modifications and variations of this invention provided they fall within the scope of the following claims.

What is claimed is:

1. A display panel, comprising:
   a substrate;
   a plurality of pixel structures, wherein at least one of the pixel structures comprises:
   a first metal layer on the substrate, and the first metal layer comprising a scan line;
   a first insulation layer on the substrate and the first metal layer;
   a second metal layer on the first insulation layer, and the second metal layer comprising a touch sensing line and a data line;
   a second insulation layer on the first insulation layer and the second metal layer, wherein the second insulation layer has a first opening to expose a portion of the touch sensing line as a first connection part;
   a common electrode on the second insulation layer, wherein the common electrode has a second opening above the first opening;
   a third insulation layer on the common electrode, wherein the third insulation layer has a third opening above the second opening, and the third opening exposes a portion of the common electrode as a second connection part; and
   a connection electrode on the third insulation layer, wherein the connection electrode connects the first connection part to the second connection part through the third opening, the second opening, and the first opening.

2. The display panel of claim 1, wherein a ratio of an area of the portion of the second connection part exposed by the third opening to an area of the third opening is in a range from 0.1 to 1.

3. The display panel of claim 1, wherein the second connection part is partially overlapped with the first opening.

4. The display panel of claim 1, wherein the connection electrode is in contact with the first connection part by a first contact area, the connection electrode is in contact with the second connection part by a second contact area, and a ratio of the first contact area to the second contact area is in a range from 0.1 to 10.

5. The display panel of claim 1, wherein the at least one pixel structure comprises:
a gate formed by the first metal layer;
a source and a drain formed by the second metal layer;
a semiconductor layer spatially separated from the gate; and
a pixel electrode on the third insulation layer, wherein the pixel electrode has at least one slit, and the pixel electrode and the connection electrode are forming by a same process,
wherein the second insulation layer further comprises a fourth opening to expose a portion of the drain, the common electrode has a fifth opening overlapped with the fourth opening, and the third insulation layer has a sixth opening overlapped with the fourth opening,
wherein the pixel electrode is connected to the drain through the fourth opening, the fifth opening and the sixth opening.

6. The display panel of claim 5, wherein the fifth opening is in a position above the semiconductor layer along a direction perpendicular to the substrate.

7. The display panel of claim 5, wherein an area of the second opening is smaller than an area of the fifth opening from a top view perpendicular to the substrate.

8. The display panel of claim 1, wherein the touch sensing line has an extending portion, and the extending portion overlaps with an area of the third opening along a direction perpendicular to the substrate.

9. The display panel of claim 8, wherein the extending portion overlaps with the scan line along a direction perpendicular to the substrate.

10. The display panel of claim 1, wherein an area of the connection electrode is greater than an area of the third opening, and the connection electrode comprises:
a first portion overlapped with the third opening and connected to the common electrode;
a second portion partially overlapped with the third opening and connected to the touch sensing line; and
a third portion not overlapped with the third opening, wherein the third portion is formed on the third insulation layer and is connected to the first portion and the second portion.

11. The display panel of claim 1, further comprising:
a plurality of touch electrodes, wherein each of the touch electrodes corresponds to a portion of the pixel structures, and a gap between the touch electrodes is located between the touch sensing line and another data line adjacent to the touch sensing line.

12. A display panel having a display area and a non-display area, the display panel comprising:
a substrate;
a pixel structure in the display area, wherein the pixel structure comprises:
a first conductive layer on the substrate, and the first conductive layer comprising a scan line and a gate;
a first insulation layer on the first conductive layer;
a semiconductor layer disposed on or under the first insulation layer;
a second conductive layer on the first insulation layer, the second conductive layer comprising a touch sensing line, a data line, a source and a drain;
a second insulation layer on the first insulation layer and the second conductive layer, wherein the second insulation layer has a first opening to expose a portion of the touch sensing line;
a first transparent electrode on the second insulation layer, the first transparent electrode having a second opening located above the first opening;
a third insulation layer on the first transparent electrode, wherein the third insulation layer has a third opening above the second opening, and the third opening exposes a portion of the first transparent electrode; and
a connection electrode that is disposed on the third insulation layer, and electrically connects the first transparent electrode to the touch sensing line through the third opening, the second opening and the first opening,
wherein an area of the third opening is partially overlapped with an area of the second opening.

13. The display panel of claim 12, wherein a contour of the third opening and a contour of the second opening intersect at at least two locations, and a portion of the contour of the third opening is in an area of the second opening from a top view perpendicular to the substrate.

14. The display panel of claim 12, wherein the touch sensing line has an extending portion, and the extending portion is overlapped with the third opening along a direction perpendicular to the substrate.

15. The display panel of claim 14, wherein the extending portion is overlapped with the scan line along a direction perpendicular to the substrate.

16. The display panel of claim 15, wherein the scan line extends along a first direction, the touch sensing line extends along a second direction, and an angle included between the first direction and the touch sensing line is in a range from 75 degrees to 105 degrees.

17. The display panel of claim 14, wherein at least one of the first transparent electrode and the extending portion is in an area overlapped with the third opening and the scan line along a direction perpendicular to the substrate.

18. The display panel of claim 14, wherein the extending portion covers a segment of the scan line, and an edge of the extending portion is spaced from the scan line by a distance greater than or equal to 1.2 micro meters.

19. The display panel of claim 12, wherein a width of the touch sensing line is greater than a width of the data line.

20. The display panel of claim 12, further comprising:
a second transparent electrode on the third insulation layer, wherein the second transparent electrode has a slit pattern.

21. The display panel of claim 20, wherein the first transparent electrode is a common electrode, the second transparent electrode is a pixel electrode, and the pixel electrode is electrically connected to the drain.

22. The display panel of claim 20, wherein the first transparent electrode is a pixel electrode and is electrically connected to the drain, and the second transparent electrode is a common electrode.

23. The display panel of claim 12, wherein the connection electrode covers over half of the third opening.

24. The display panel of claim 12, further comprising:
an opposite substrate disposed opposite to the substrate; and
a liquid crystal layer between the substrate and the opposite substrate.

25. The display panel of claim 12, wherein the semiconductor layer is formed by polysilicon and is located under the first insulation layer.

26. The display panel of claim 12, wherein the semiconductor layer is formed by continuous grain silicon, amorphous silicon or oxide semiconductor, and is above the first insulation layer.

27. The display panel of claim 12, wherein the portion of the first transparent electrode exposed by the third opening is overlapped with the first opening along a direction perpendicular to the substrate.

28. A display panel, comprising:
a substrate;
a pixel structure comprising:
a scan line extending along a first direction;
a data line extending along a second direction;
a first insulation layer between the scan line and the data line;
a touch sensing line extending along the second direction and on the first insulation layer, wherein an angle between the touch sensing line and the first direction is in a range from 75 degrees to 105 degrees;
a second insulation layer on the first insulation layer and the touch sensing line, wherein the second insulation layer has a first opening to expose a portion of the touch sensing line;
a touch electrode on the second insulation layer, wherein the touch electrode has a second opening located above the first opening, and the second opening is at least partially overlapped with the touch sensing line along a direction perpendicular to the substrate;
a third insulation layer on the touch electrode, wherein the third insulation layer has a third opening above the second opening, and the third opening exposes a portion of the touch electrode;
a connection electrode on the third insulation layer, wherein the connection electrode is connected to the portion of the touch electrode and the portion of the touch sensing line through the third opening, the second opening and the first opening; and
a pixel electrode having a slit pattern and on the third insulation layer.

29. The display panel of claim 28, further comprising:
an opposite substrate disposed opposite to the substrate; and
a liquid crystal layer disposed between the substrate and the opposite substrate, wherein the liquid crystal layer comprises a plurality of positive liquid crystal molecules, negative liquid crystal molecules or a combination thereof;
wherein alignment films are disposed at a side of the substrate and a side of the opposite substrate that are adjacent to the liquid crystal layer.

30. A method for manufacturing a display panel, the method comprising:
providing a substrate:
forming a patterned first conductive layer on the substrate, wherein the patterned first conductive layer comprises a scan line and a gate;
forming a first insulation layer on the patterned first conductive layer;
forming a patterned semiconductor layer on the first insulation layer or under the first insulation layer;
forming a patterned second conductive layer on the first insulation layer, wherein the patterned second conductive layer comprises a touch sensing line, a data line, a source and a drain;
forming a second insulation layer on the patterned second conductive layer;
forming a patterned first transparent electrode on the second insulation layer, wherein the patterned first transparent electrode has a second opening;
forming a third insulation layer on the patterned first transparent electrode;
performing an etching process corresponding to the third insulation layer and the second insulation layer, so as to form a third opening in the third insulation layer and form a first opening in the second insulation layer, wherein the third opening exposes a portion of the patterned first transparent electrode, an area of the third opening is partially overlapped with an area of the second opening, and the first opening exposes a portion of the touch sensing line; and
forming a connection electrode on the third insulation layer, wherein the connection electrode electrically connects the first transparent electrode to the touch sensing line through the third opening, the second opening, and the first opening.

31. The method of claim 30 further comprising:
forming a patterned light shielding layer on the substrate and under the semiconductor layer;
forming a fourth insulation layer on the patterned light shielding layer, wherein the fourth insulation layer is disposed between the substrate and the first insulation layer; and
forming a fifth insulation layer on the patterned semiconductor layer, wherein the patterned semiconductor layer is under the gate.

32. The method of claim 30 further comprising:
forming a pixel electrode on the third insulation layer;
wherein the patterned first transparent electrode further comprises a fifth opening, the etching process performed corresponding to the third insulation layer and the second insulation layer further comprises forming a fourth opening in the second insulation layer and forming a sixth opening in the third insulation layer in the etching process, the pixel electrode is connected to the drain through the fourth opening, the fifth opening, and the sixth opening, and the connection electrode and the pixel electrode are formed by a same process.

33. The method of claim 30, wherein
the patterned first transparent electrode comprises a touch electrode having an approximate rectangular contour, wherein the ratio of the approximate rectangular contour's length to the approximate rectangular contour's width is in a range from 1:1 to 1.3:1.

34. The method of claim 30, wherein the etching process performed corresponding to the third insulation layer and the second insulation layer comprises:
etching the second insulation layer along a direction parallel with the substrate in the etching process forming the first opening, so as to generate under cutting beneath the patterned first transparent electrode.

35. The method of claim 30 further comprising:
forming a contact hole in the first insulation layer;
wherein a portion of the patterned second conductive layer is electrically connected to a portion of the patterned first conductive layer through the contact hole in a non-display area.

* * * * *